United States Patent [19]
Waldman et al.

[11] Patent Number: 5,223,796
[45] Date of Patent: Jun. 29, 1993

[54] APPARATUS AND METHODS FOR MEASURING THE DIELECTRIC AND GEOMETRIC PROPERTIES OF MATERIALS

[75] Inventors: Francis A. Waldman, Stoneham; Philip A. von Guttenberg, Cambridge, both of Mass.

[73] Assignee: Axiomatics Corporation, Woburn, Mass.

[21] Appl. No.: 706,406

[22] Filed: May 28, 1991

[51] Int. Cl.⁵ .............................................. G01R 27/26
[52] U.S. Cl. .................................... 324/687; 324/690; 324/688
[58] Field of Search ............... 324/686, 687, 688, 663, 324/661, 662, 670, 671, 649, 652; 73/61 R, 61.1 R

[56] References Cited

U.S. PATENT DOCUMENTS

| | | | |
|---|---|---|---|
| 3,231,815 | 1/1966 | Spencer | 324/686 |
| 3,515,987 | 6/1970 | Zurbrick et al. | 324/687 |
| 3,826,979 | 7/1974 | Steinmann | |
| 4,555,941 | 12/1985 | Fathauer et al. | 324/688 |
| 4,559,493 | 12/1985 | Goldberg et al. | 73/61.1 R |
| 4,560,923 | 12/1985 | Hanson | 324/687 |
| 4,751,842 | 6/1988 | Ekrann et al. | 73/61.1 R |
| 4,757,252 | 7/1988 | Maltby et al. | |
| 4,845,421 | 7/1989 | Howarth et al. | 324/688 |
| 4,899,101 | 2/1990 | Porges | 324/71.1 |
| 4,908,574 | 3/1990 | Rhoades et al. | 324/690 |
| 4,972,154 | 11/1990 | Bechtel et al. | 324/688 |
| 4,992,741 | 2/1991 | Douglas et al. | 324/687 |
| 5,025,222 | 6/1991 | Scott et al. | 324/639 |
| 5,045,798 | 9/1991 | Hendrick | 324/687 |
| 5,568,874 | 2/1986 | Kramer et al. | |

FOREIGN PATENT DOCUMENTS 2214640A  9/1989  European Pat. Off. ............ 324/658

Primary Examiner—Jack B. Harvey
Assistant Examiner—Maura K. Regan
Attorney, Agent, or Firm—Choate, Hall & Stewart

[57] ABSTRACT

Apparatus and methods for measuring the properties of a material by employing a driven electrode, a sensing electrode and a shunting electrode. The shunting electrode is disposed in proximity to the driven and sensing electrodes and functions to increase the sensitivity of electrical measurements made between the driven and sensing electrodes by influencing the coupling of the imposed electric field to the sensing electrode to a degree related to the properties of the material under test.

70 Claims, 23 Drawing Sheets ated by John F. Kennedy Space Center. The Government has certain rights in this invention.

APPARATUS AND METHODS FOR MEASURING THE DIELECTRIC AND GEOMETRIC PROPERTIES OF MATERIALS

This invention was maee with Government support under contract NAS10-11657 awarded by John F. Kennedy Space Center. The Government has certain rights in this invention.

BACKGROUND OF THE INVENTION

This invention relates to dielectrometry and, in particular, to the measurement of electrical parameters to deduce the physical properties of a material under test (MUT).

Dielectric sensors permit the measurement of various physical properties of a MUT. These properties include the permittivity, conduction and dielectric losses, thickness, and the proximity or position of the MUT with respect to the electrodes of the sensor. Additional properties that affect those listed above can be inferred from the constitutive laws governing the MUT or by empirical calibration. For example, the concentration of a salt in a solution can be measured because the conductivity of the solution is proportional to the concentration.

Dielectric measurements can be made with a variety of apparatus and methods. The simplest device employs the use of an immersible electrode structure. This apparatus may take on the form of parallel plates, concentric cylinders, or neighboring spheres. Where the dominant electric field is uniform, the effect of the fringing fields is minimized by the use of a guarded electrode in the perimetry of the sensing electrode. In the absence of a guard ring, the fringing fields are accounted for by determining the geometric cell constant. The admittance is proportional to the permittivity and the conductivity of the MUT as well as the geometry of the structure. The measured signal is sensitive to the conductivity of the MUT at low frequencies ($\omega\tau_e < < 1$) and to the permittivity of the MUT at higher frequencies ($\omega\tau_e > > 1$). Conductivity measurements with DC potentials are avoided to insure that electrochemical effects at the interface between the MUT and the electrodes do not dominate the response. The utility of these structures is limited by their inability to make measurements non-invasively, i.e. without making contact with the MUT. If the MUT contacts the electrodes, interfacial phenomena can introduce errors in the measurement. Moreover, long term effects such as fouling, corrosion, and contamination can also detract from their usefulness.

When the measurement is made non-invasively, the electrodes are typically coplanar and insulated from the MUT. These structures avoid the need to trap the MUT between the electrodes and can be used to monitor the condition of a MUT as it flows through a pipe. In these devices the presence of an insulating layer reduces the sensitivity to conduction processes at low frequencies. Higher frequencies ($\omega\tau_e \sim 1$) are necessary to achieve the same sensitivity as in the immersible structures. For example, frequencies in the gigahertz range are necessary for salt water. At these frequencies, dielectric losses can significantly affect the measured loss. As compared to measurements at low frequency, high frequency measurements increase the complexity and cost of the sensor and associated instrumentation.

A number of devices that utilize a fringing field for non-invasive measurements are described in the art. These devices typically employ a third electrode acting as a shield or guard for two primary electrodes. Examples are disclosed in U.S. Pat. No. 3,826,979 by Steinmann, U.S. Pat. No. 4,568,874 by Kramer and Maltby, and U.S. Pat. No. 4,757,252 by Maltby et al. However, these devices are ill-suited for measuring the properties of conducting MUTs.

There exists a need for better devices and methods for measuring the properties of MUTs non-invasively, particularly when the MUT is a conductor. There exists a need for an apparatus that allows non-invasive measurements to be made at low frequencies with sufficient sensitivity. Furthermore, there exists a need for methods for inferring multiple properties of a MUT from a single measurement, preferably on a continuous and instantaneous basis. For example, it would be desirable to simultaneously measure both the relative concentration of a solute in a solvent and the thickness of the solution on a surface. In the measurement of a complex quantity, the real and imaginary parts may be used to solve for two variables, such as conductivity and thickness.

SUMMARY OF THE INVENTION

In one aspect, the invention is a sensor for measuring the properties of a MUT. The sensor includes an electrode pair having a driven electrode and a sensing electrode positioned in proximity to the MUT. Terminals are provided for connecting the driven electrode to an electrical signal generator to provide an electrical signal and to generate an electric field which couples to the sensing electrode. In this way, an electrical signal is generated at the sensing electrode. Terminals are also provided for connecting the sensing electrode to an electrical signal receiver to receive the signal at the sensing electrode. It should be noted that the sensing and driven electrodes can be interchanged in their function without changing the signal being measured. The sensor further includes a shunting electrode positioned in external proximity to the electrode pair and in proximity to the MUT. Importantly, the shunting electrode is positioned and held at an electrical potential such to influence the coupling of the electric field to the sensing electrode to a degree related to the properties of the MUT. The sensor therefore permits measurement of properties of the MUT from the signal at the sensing electrode.

In preferred embodiments, the electrical signal provided to the driven electrode is an AC signal, and the shunting electrode is maintained at a fixed potential, such as ground potential.

In some embodiments, the electrodes are substantially flat, and the shunting electrode has a substantially greater surface area than the sensing electrode. In particular embodiments, the electrodes are formed as parallel strips or as concentric rings of a conducting material with the shunting electrode being wider than the sensing electrode and the driven electrode.

In some embodiments, one of the electrodes of the electrode pair is formed of two distinct but electrically connected conducting structures disposed on either side of the other electrode of the electrode pair, and the shunting electrode is formed of two distinct but electrically connected conducting structures disposed on either side of the electrode pair. In particular, according to one embodiment, one of the electrodes of the electrode pair is formed as a first strip of a conducting material and the other electrode of the electrode pair is formed as electrically-connected second and third strips of a conducting material, the second and third strips disposed parallel to the first strip, one on each side of the first strip, and the shunting electrode is formed as electrically-connected fourth and fifth strips of a conducting material, the fourth and fifth strips disposed parallel to the first, second, and third strips, the fourth strip adjacent to the second strip, and the fifth strip adjacent to the third strip. In one embodiment, the first, second, and third strips are approximately the same length, the width of the first strip is approximately twice the widths of the second and third strips, and the distances between the first and the second strips and between the first and the third strips are approximately equal to the width of the second and third strips. The fourth and fifth strips have approximately the same length and are wider than the first, second, and third strips, and the distances between the second and fourth strips and between the third and fifth strips are approximately equal to the width of the second and third strips.

In some embodiments, the sensor further includes a ground electrode positioned in proximity to the driven, sensing, and shunting electrodes. In one embodiment, the electrodes are formed on an insulating substrate having a grounded back plane. The grounded back plane and the shunting electrode may be electrically connected. In particular, the grounded back plane and the shunting electrode may be formed of a continuous strip of a conducting material.

In some embodiments, the driven, sensing, and shunting electrodes are separated from the MUT by an insulating layer. In other embodiments, the shunting electrode is exposed to the MUT. In particular, the shunting electrode may be porous and exposed to the MUT to allow the MUT to flow through it.

In some embodiments, the driven, sensing, and shunting electrodes are substantially flat and coplanar. In other embodiments, the sensor may be flexible.

In a particular embodiment, the driven, sensing, and shunting electrodes are disposed on a wall of a pipe, or other container, through which the MUT flows. In one variation of this embodiment, the driven and sensing electrodes are disposed on and insulated from an inner wall of a conducting pipe through which the MUT flows. In this configuration, the conducting pipe itself functions as the shunting electrode and as a ground plane. In another variation of this embodiment, the driven, sensing, and shunting electrodes are disposed on an outer wall of an insulating structure, such as a pipe, containing the MUT.

In some embodiments, the driven and sensing electrodes are disposed in a first plane and the shunting electrode is disposed in a second plane parallel to the first plane. In particular embodiments, the first plane and the second plane are concentric cylinders.

In some embodiments, the sensor further includes a temperature sensor for measuring the temperature of the MUT.

In another aspect, the invention is an apparatus for measuring the properties of a MUT. The apparatus includes an electrode pair having a driven electrode and a sensing electrode positioned in proximity to the MUT. An electrical signal generator is connected to the driven electrode to provide an electrical signal to the driven electrode to generate an electric field which couples to the sensing electrode. In this way, an electrical signal is generated at the sensing electrode. An electrical signal receiver is connected to the sensing electrode to receive the signal at the sensing electrode. The apparatus further includes a shunting electrode positioned in proximity to the electrode pair and in proximity to the MUT. Importantly, the shunting electrode is positioned and held at an electrical potential such to influence the coupling of the electric field to the sensing electrode to a degree related to the properties of the MUT. Measurement apparatus is provided to measure an electrical parameter or parameters describing the coupling of the electric field between the driven electrode and the sensing electrode. This measurement is made in response to the electrical signals at the driven and sensing electrodes. Computing apparatus is provided for estimating one or more quantities relating to the properties of the MUT from the measured parameters.

In some embodiments, the shunting electrode is positioned externally to the driven and sensing electrodes of the electrode pair. All other electrode configurations and embodiments described above in relation to the sensor are appropriate for use in the apparatus.

In yet another aspect, the invention is a method for measuring the properties of a MUT. The method includes disposing an electrode pair having a driven electrode and a sensing electrode in proximity to the MUT. An electrical signal is provided to the driven electrode to generate an electric field which couples to the sensing electrode. In this way, an electrical signal is generated at the sensing electrode. The method further includes disposing a shunting electrode in proximity to the electrode pair and the MUT. Importantly, the shunting electrode is positioned and held at a potential such that the shunting electrode influences the coupling of the electric field to the sensing electrode to a degree related to the properties of the MUT. According to the method, an electrical parameter or parameters are measured which describe the coupling of the electric field between the driven electrode and the sensing electrode. This measurement is made in response to the electrical signals at the driven and sensing electrodes. One or more quantities relating to the properties of the MUT are estimated from the measured parameters.

In some embodiments, the electrical parameter or parameters describing the coupling of the electric field may include a complex transfer admittance or a complex gain measured between the driven electrode and the sensing electrode, or if the electrodes are incorporated in an RLC circuit, a resonant frequency and Q factor.

Quantities relating to the properties of the MUT which can be measured according to the method include the permittivity of the MUT, the conduction and/or dielectric losses of the MUT, the thickness of the MUT, the spatial relationship of the sensor relative to the MUT, or a quantity representative of a property of the MUT that affects the permittivity and/or the conduction and/or dielectric losses of the MUT. In particular, a concentration of a solute in a solvent, or a degree of emulsification are quantities that can be measured.

In some embodiments, the method further includes selecting the size of the shunting electrode or selecting the frequency of the driving electrical signal to provide optimum sensitivity for a measurement of interest. In some embodiments, the electrical parameter or parameters are measured at a plurality of frequencies to quantify properties of multicomponent MUTs. In some embodiments, parameter estimation techniques are employed to infer a quantity relating to the properties of a MUT from the measured parameters.

One application of the invention is the measurement of solutes in solvents, particularly salts in water. The sensor can be used, for example, for water quality measurements to test for industrial compliance with EPA guidelines. If the solutes are nutrients, the sensor can be used to control plant growth, particularly under stringently controlled circumstances, such as in space stations.

Another application of the invention is the measurement of the degree of dispersion in an emulsion. This has applicability in industries ranging from petrochemicals to cosmetics. An example of an emulsion is the finish applied to polymer fibers such as nylons and polyesters for clothes and carpets. Such emulsions are typically surfactants in water used in concentrations below 10% by weight. Because the dissociation of the surfactant affects the conductivity of the dispersion, the measurement of the loss gives a relative indication of the degree of dispersion in the emulsion. Such a measurement could provide means to control an on-line process.

DESCRIPTION OF THE PREFERRED EMBODIMENT

Sensor Geometries

Figure 1:
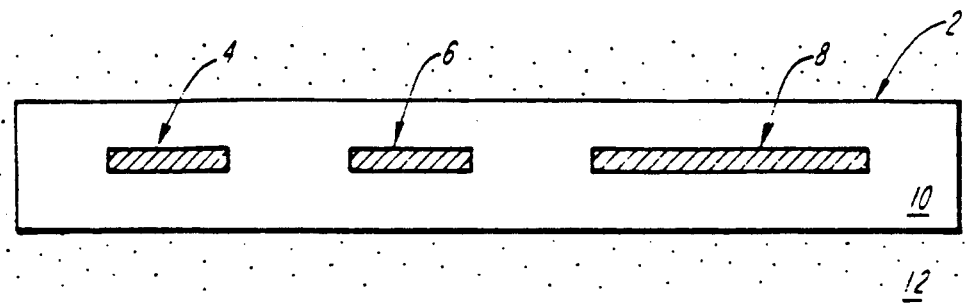
FIG. 1 is a schematic cross-sectional view of a basic dielectric sensor incorporating a shunting electrode in accordance with the present invention.
Figure 2:
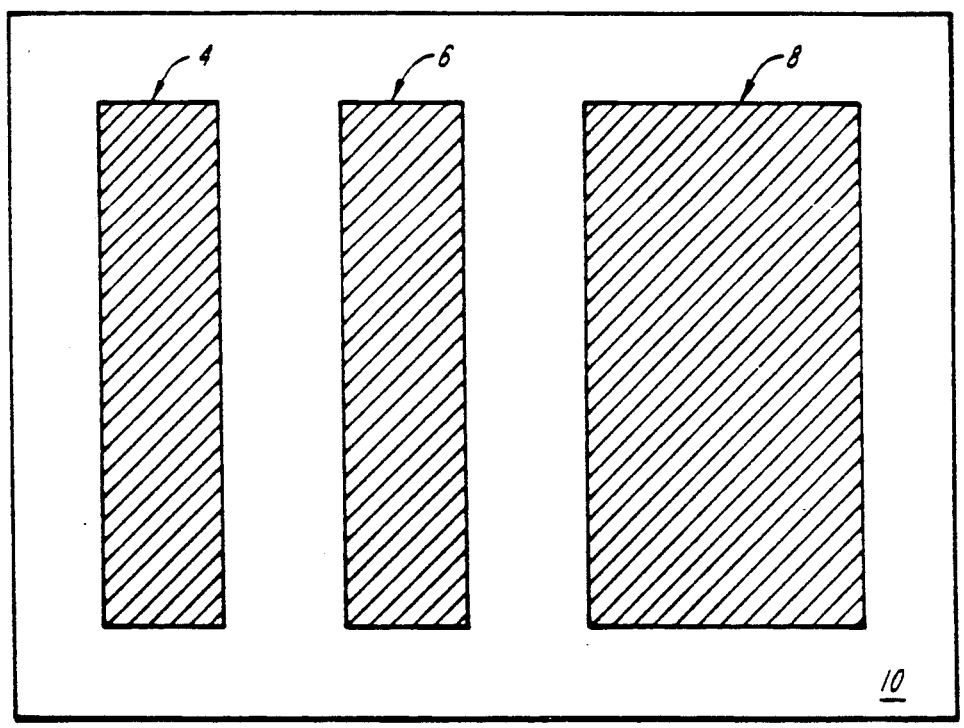
FIG. 2 is a schematic top view of the dielectric sensor of FIG. 1.

A simple embodiment of the dielectric sensor described in this invention is illustrated in cross-section in FIG. 1 and in top view in FIG. 2. In the illustrated embodiment, the sensor 2 includes three coplanar electrodes 4, 6 and 8 that are completely insulated from each other and from the MUT 12 by an insulating layer 10. The MUT 12 can be homogeneous or heterogeneous. The driven electrode 4 is preferably supplied by an AC voltage at a specified frequency. The sensing electrode 6 senses the coupling of the imposed electric field through the surrounding medium. The penetration depth of the quasistatic field above the driven and sensing electrodes 4 and 6 is approximately equal to the electrode separation. In an electrical measurement, the driven and sensing electrodes 4 and 6 can be interchanged in their function without changing the signal being measured. This reciprocity condition is a direct result of Tellegen's theorem (See *Introductory Network Theory* by A. G. Bose and K. N. Stevens, Harper & Row, New York, 1965, Chapter 7). The third electrode 8 is a shunting electrode. Typically at ground potential, this electrode shunts the electric field from the sensing electrode 6. Thus, the effect of the shunting electrode 8 is to decrease the signal measured by the sensing electrode 6 to a degree related to the properties of the MUT 12.

Figure 3A:
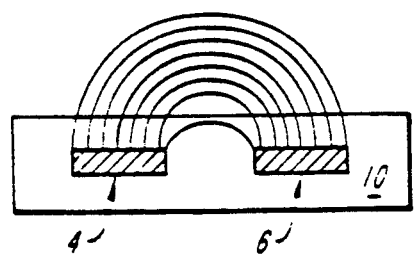
FIGS. 3a, 3b, and 3c are schematic illustrations of the electric field generated between a driven and a sensing electrode in the absence of a shunting electrode, in the presence of a shunting electrode, and in the presence of a shunting electrode and a conducting MUT.
Figure 3B:
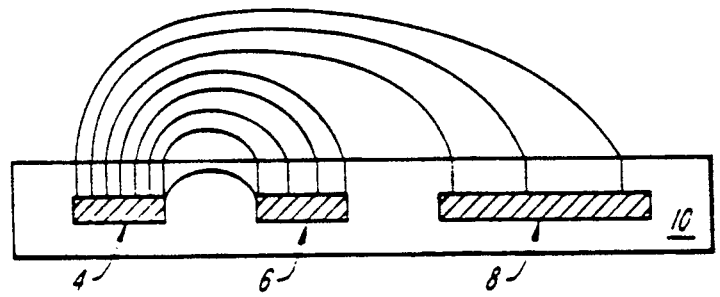
Figure 3C:
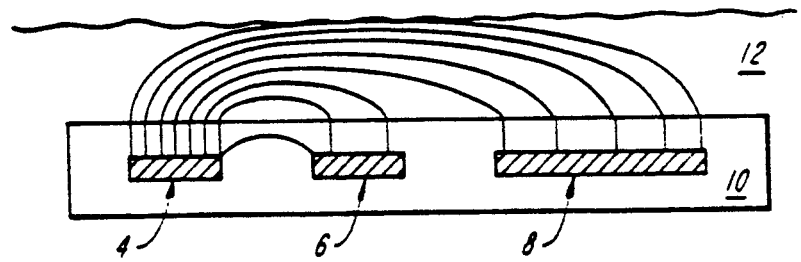

In a conventional sensor without a shunting electrode, the electric field distribution would be as illustrated in FIG. 3a. Note that only the field above the plane of the electrodes is shown. The addition of shunting electrode 8 changes the field distribution as illustrated in FIG. 3b. The presence of a conducting MUT 12 greatly enhances the shunting effect as illustrated in FIG. 3c. For this reason, this apparatus is sensitive to the dielectric and geometric properties of the MUT 12. Because the signal measured is proportional to the electric field at the sensing electrode 6, changes in the dielectric or the geometric properties of the MUT 12 affect the measured signal.

The functionality of the shunting electrode 8 is in contradistinction to that of the shielding electrode disclosed in U.S. Pat. No. 3,826,979. Therein Steinmann teaches the use of a shielding electrode positioned between a transmitting and a receiving electrode. The field imposed by applying a voltage to the transmitting electrode couples primarily to the shielding electrode. However, when a material with a permittivity much greater than that of the medium between the electrodes is brought near the electrode configuration, a greater proportion of the field couples to the receiving electrode, thereby increasing the measured signal. The functionality of the shunting electrode 8 is also in contradistinction to the guard electrode disclosed in U.S. Pat. Nos. 4,568,874 and 4,757,252. Therein, the use of a guard electrode positioned between a probe electrode and a ground electrode is taught. The guard electrode is held at a potential approximately equal to the potential of the probe electrode, acting to increase the penetration depth of the electric field between the probe and ground electrodes and to decrease the sensitivity of the measured signal to the presence of a thin conducting layer above the electrodes.

Although it is possible to locate the shunting electrode 8 between the driven electrode 4 and the sensing electrode 6, it is preferable to keep the shunting electrode 8 external to the driven and sensing electrodes, as depicted in FIGS. 1 and 2, so that the shunting effect can be maximized. Herein, the term "in external proximity" will be used to describe the spatial relationship of the shunting electrode relative to the driven and sensing electrodes for this configuration.

Figure 4:
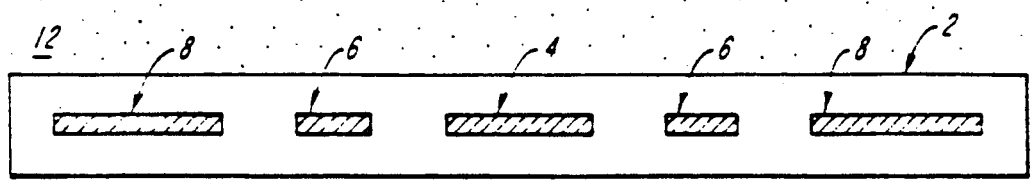
FIG. 4 is a schematic cross-sectional view of another embodiment of a dielectric sensor according to the invention, wherein the electrodes are configured symmetrically.
Figure 5:
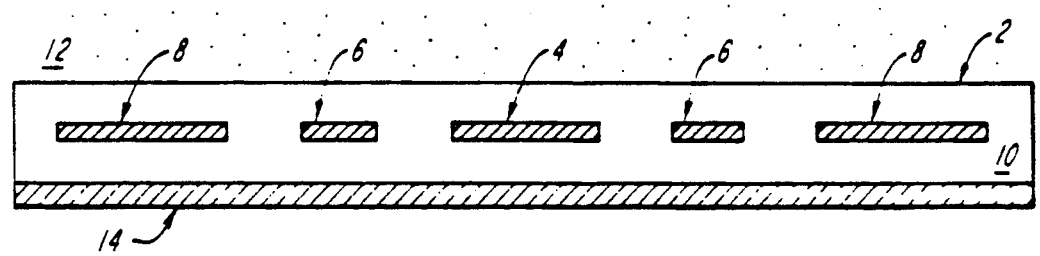
FIG. 5 is a schematic cross-sectional view of yet another embodiment of a dielectric sensor according to the invention, further including a ground plane.
Figure 6:
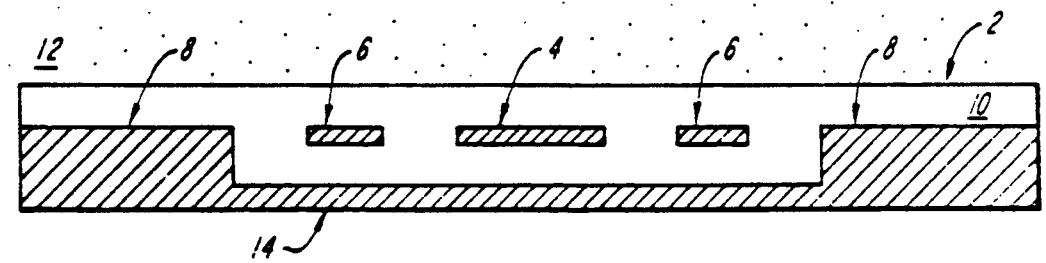
FIG. 6 is a schematic cross-sectional view of yet another embodiment of a dielectric sensor according to the invention wherein the shunting electrodes and the ground plane are formed as a single element.

In practice, the apparatus can be much improved from that depicted in FIG. 1. For example, by making the spatial arrangement of the electrodes symmetrical as illustrated in FIG. 4, the sensor response can be more readily modeled. If the MUT 12 is present only on one side of the sensor 2, a fourth electrode in the form of a ground plane 14 can be added as shown in FIG. 5 to enhance the sensitivity of the sensor. The ground plane 14 has the effect of shielding the other electrodes from the effects of external sources of noise and of increasing the sensitivity of the sensor to changes in the dielectric properties of the MUT 12 above. This same effect can be achieved by extending the shunting electrode 8 as shown in FIG. 6.

Figure 7:
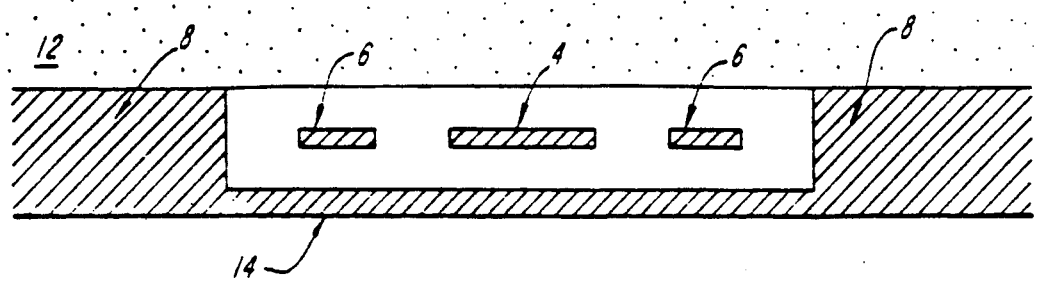
FIG. 7 is a schematic cross-sectional view of yet another embodiment of a dielectric sensor according to the invention wherein the shunting electrodes and the ground plane are formed as a single element and the shunting electrode is exposed to the MUT.

A further improvement may be achieved if the MUT 12 is permitted to contact the shunting electrode 8, as illustrated in FIG. 7. This is recommended particularly in applications where contact of the shunting electrode with the material will not produce adverse effects such as corrosion. In some applications, it may be desirable to make the shunting electrode out of a porous material such that the MUT may flow through it. An example of an appropriate material for a porous shunting electrode is sintered stainless steel.

Figure 8:
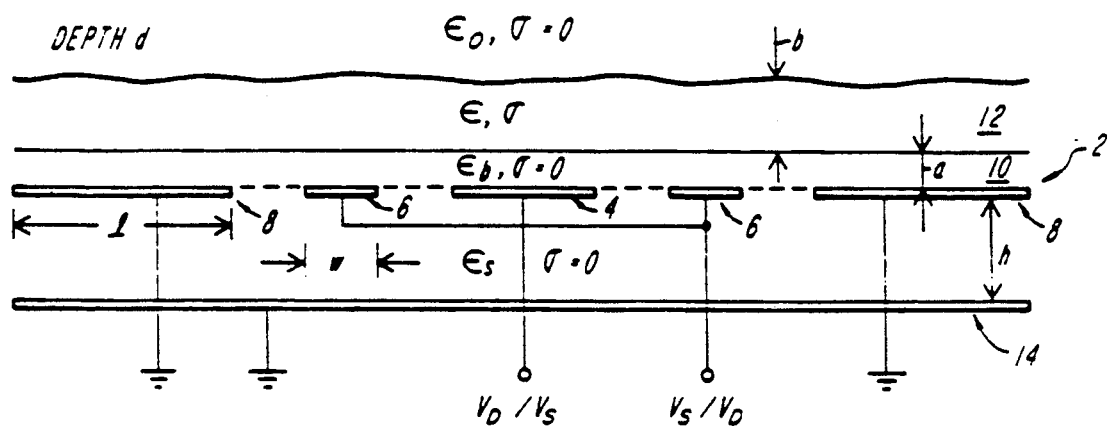
FIG. 8 is a schematic cross-sectional view of an embodiment of a dielectric sensor according to the invention showing the electrical connections and the dimensions and electrical parameters of interest.

FIG. 8 is an illustration of a preferred embodiment of a dielectric sensor according to the invention showing the electrical connections to the electrodes. In this embodiment, the shunting electrodes 8 and the ground plane 14 are grounded. The driven electrode 4 and the sensing electrodes 6 are connected to electrical circuitry. To emphasize the fact that the functions of the driven and sensing electrodes 4 and 6 are interchangable, their terminal connections are labelled $V_D/V_S$ and $V_S/V_D$ to indicate that either the driven or sensed electrical signals can appear there.

FIG. 8 indicates dimensions and electrical parameters of particular interest. In the illustrated embodiment, the driven electrode is twice as wide as either of the two identical sensing electrodes. Note that the driven and sensing electrodes cover equal total area. Denoting the width of each sensing electrode as w, the width of the driven electrode is 2w. The two shunting electrodes have equal width denoted by l. The distances between the electrodes are all equal to w in this embodiment. The MUT has a conductivity $\sigma$, a permittivity $\epsilon$, and a thickness b. The insulating base between the MUT and the electrodes has a permittivity $\epsilon_b$ and a thickness a. The insulating substrate between the ground plane and the electrodes has a permittivity $\epsilon_s$ and a thickness h. The electrodes all have a depth d into the figure.

The most important geometric property of the sensor of FIG. 8 is the ratio of the width l to the width w. As the ratio l/w increases, the sensitivity of the measured signal to changes in the MUT increases substantially. Equally as important, as the ratio l/w increases, the frequency of the peak response lowers. These properties will be illustrated below using lumped-parameter and continuum models.

The magnitude of the signal at the sensing electrode is linearly proportional to the length d of the electrodes. Therefore, the length d should be adjusted according to the anticipated MUT response to make the measured values sufficiently large as to exceed the noise level but not so large as to saturate the measuring instrument. Thus, in practice, shorter sensors are used with more conducting MUTs (salt water and emulsions, for example), while longer electrodes are required with more insulating MUTs (hydrocarbons such as oils or organics such as polyols, for example).

The distance between the driven electrode and the sensing electrode determines the penetration depth of the field in the surrounding medium. Therefore, this distance becomes important when the properties to be measured include MUT thickness and/or the distance of a MUT to the sensor.

Because the electric field decays exponentially in the direction normal to the plane of the electrodes, the thickness a of the insulating base between the MUT and the electrodes should be kept as thin as possible. This ensures that most of the field penetrates the MUT and that the sensitivity of the measured signal to changes in the properties of the MUT is enhanced.

The sensitivity of the device to changes in the MUT properties is enhanced by the appropriate choice of the thickness h and the permittivity $\epsilon_s$ of the insulating substrate which isolates the ground plane from the driven and sensing electrodes. The thickness should be small compared with the width w of the electrodes and the permittivity should be minimized. Whereas increasing the substrate thickness decreases the sensitivity, decreasing the thickness beyond the optimum point reduces the signal-to-noise ratio below acceptable levels. The optimum ratio w/h for any given sensor configuration is determined either empirically or by employing a model that accurately describes the response of the sensor. For interdigitated electrode structures, optimum sensitivity is achieved by choosing the substrate thickness to be approximately one-tenth the width of electrodes (see "Continuum Properties from Interdigital Electrode Dielectometry," by M. C. Zaretsky, L. Mouayad, and J. R. Melcher, in *IEEE Transactions on Electrical Insulation*, Vol. EI-23, No. 6, pp. 897-917, December 1988).

The insulating material or materials used for the base and substrate should be a material with good insulative and barrier properties. Ideally, no MUT should penetrate the insulator as this could change the measured signal. Glass is therefore a preferred material for this purpose. More practically, there are polymers such as fluoropolymers, such as Teflon (polytetrafluoroethylene), or other polymers such as Parylene (poly(paraxylylene)) which can be easily manufactured and are adequately stable for many applications.

Figure 9:
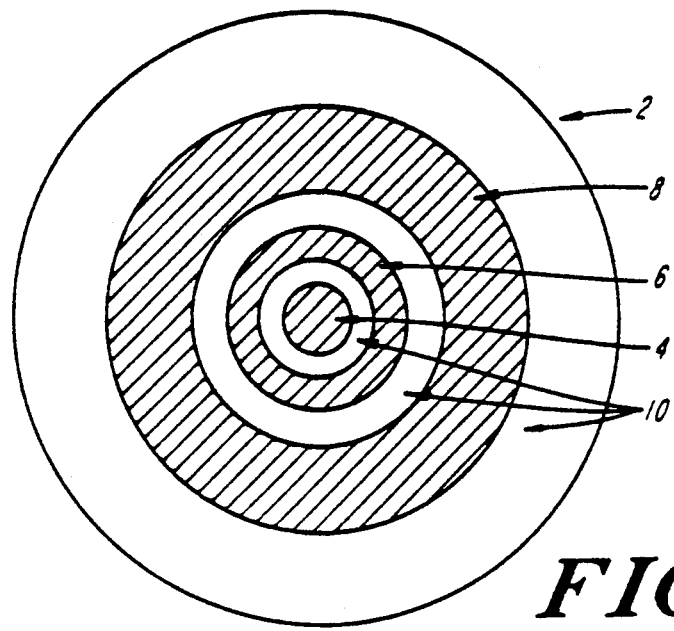
FIG. 9 is a schematic top view of a dielectric sensor according to the invention, wherein the electrodes form concentric rings.
Figure 10:
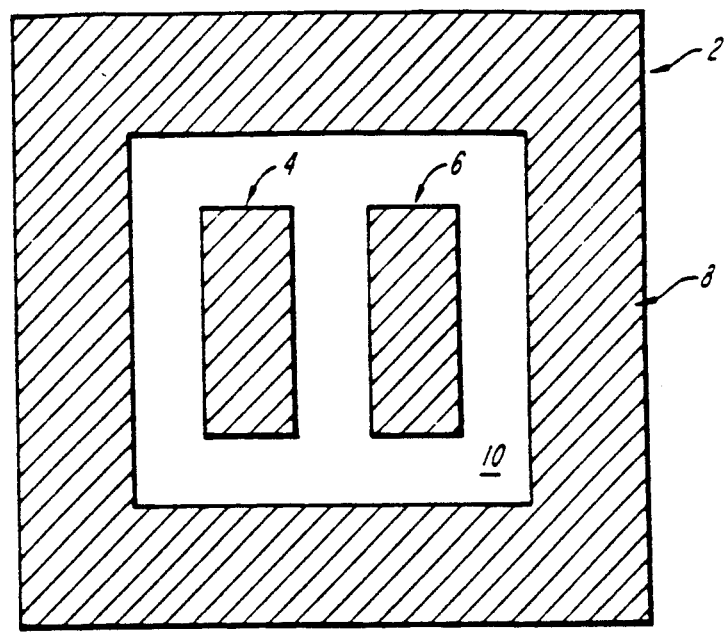
FIG. 10 is a schematic top view of a dielectric sensor according to the invention, wherein the shunting electrode surrounds the sensing and driven electrodes.

Further embodiments of the sensor apparatus are within the scope of the invention. The electrodes can be formed in a variety of shapes. In particular, the electrodes can be annular, as illustrated in one embodiment in FIG. 9. The shunting electrode can surround the driven and sensing electrodes, as illustrated in one embodiment in FIG. 10. In this embodiment, the sensing or driven electrode can be split as in FIG. 4 for symmetry. Furthermore, the electrodes need not be flat nor coplanar. A sensor according to the invention can be manufactured as a flexible film and conformed to many shapes, such as cylindrical or helical surfaces. With the appropriate construction, the sensor can be immersed in the MUT, located in fixed proximity to the MUT, or it can be attached to a wall of a pipe through which the MUT flows or to a wall of a structure containing the MUT, as will now be described.

In a particularly appropriate embodiment for applications wherein a MUT 12, as part of a process, is pumped through a pipe, the sensor 2 is disposed on a wall of the pipe 16 or fabricated as an integral part of the pipe 16, as illustrated in FIG. 11. In FIG. 11, the pipe is cut away to show the sensor inside. It is desirable that the sensor not protrude into the flow of the MUT to prevent the sensor from presenting an obstacle for any particles or objects in suspension in the MUT. Therefore, if the sensor is disposed on the inner wall of the pipe, it is preferably be flat or flush with the inner wall of the pipe.

Figure 11A:
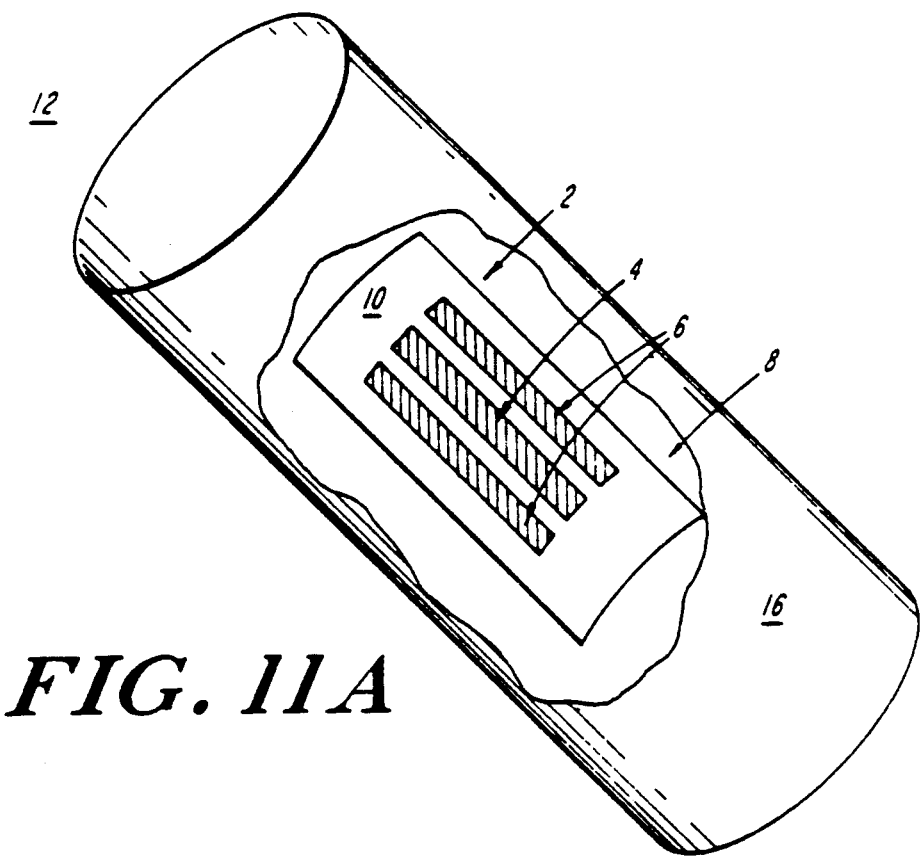
FIGS. 11a and 11b are schematic views of dielectric sensors according to the invention disposed on a wall of a pipe through which a MUT flows.
Figure 11B:
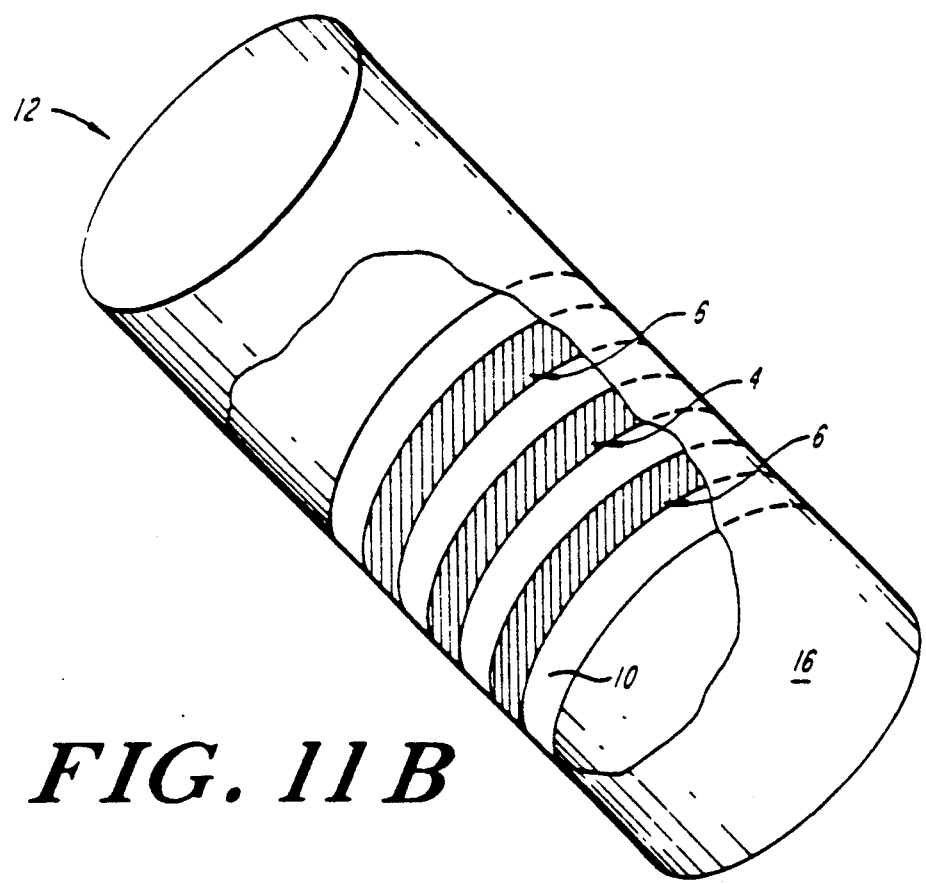

If the pipe is formed of a conducting material, the shunting electrode can conveniently be the pipe itself, as depicted in FIG. 11. If the electrodes are oriented axially along the pipe, as shown in FIG. 11a, the shunting electrode has a width determined by the radius of the pipe. If, on the other hand, the electrodes are formed as cylinders (or portions thereof) along the circumference of the pipe, as illustrated in FIG. 11b, the width of the shunting electrode is determined by the length of the pipe. In both of these configurations, the pipe also functions as a ground plane below the electrodes.

If the pipe is formed of a nonconducting material, the sensing, driven, and shunting electrodes can be disposed on the outer wall of the pipe as long as the pipe wall is thin enough to provide sufficient sensor sensitivity for a particular sensor geometry and MUT of interest. This concept can be extended to include any insulating structure containing a MUT, providing a convenient means for non-invasive measurement.

A prototype of such an embodiment has been constructed. In this prototype, the sensor is thin (0.004") and is bonded to an inner wall of a stainless steel pipe with a suitable adhesive such as superglue or cyanoacrylate. The width of the driven and sensing electrodes and the spacing between them is 0.1", which was chosen to be large relative to the thickness 0.001" of the Parylene insulation between the electrodes and the MUT. The diameter of the pipe is dictated by the desired l/w ratio, which should be at least 10 for most MUTs. If the sensor is oriented axially, then l is the circumference of the pipe minus 8w, which accounts for two driven electrodes, two sensing electrodes, and four spacings between them. For a 1" pipe, this yields an l/w ratio of 11. In practice, the electrode lengths d range from 1.5" to 10". As discussed above, the short sensors are used with more conducting MUTs, and the long electrodes for the more insulating MUTs. Using the rule-of-thumb for the thickness of the insulator between the ground plane and the electrodes described above for interdigitated structures, the thickness should be 0.01" or less for electrodes of width 0.1". In the prototype, the insulation was 0.003", yielding a ratio w/h of 33. This provides plenty of margin while still providing sufficient drive for the instrument.

Figure 12A:
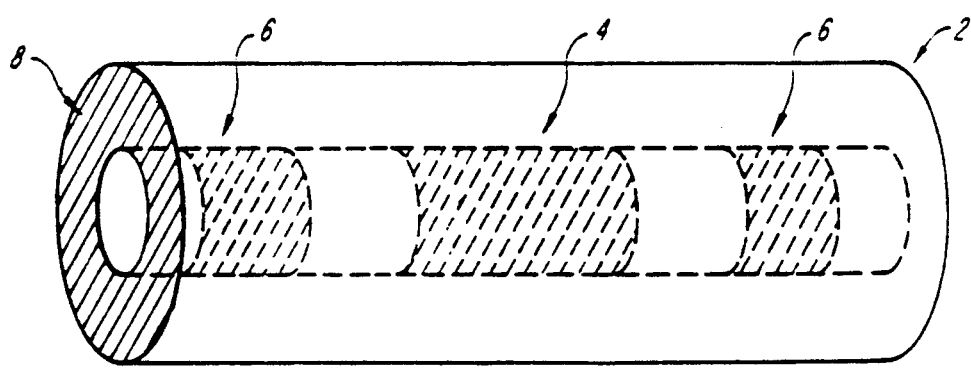
FIGS. 12a and 12b are schematic views of a dielectric sensor according to the invention wherein the electrode pair and the shunting electrode are disposed on concentric cylinders.
Figure 12B:
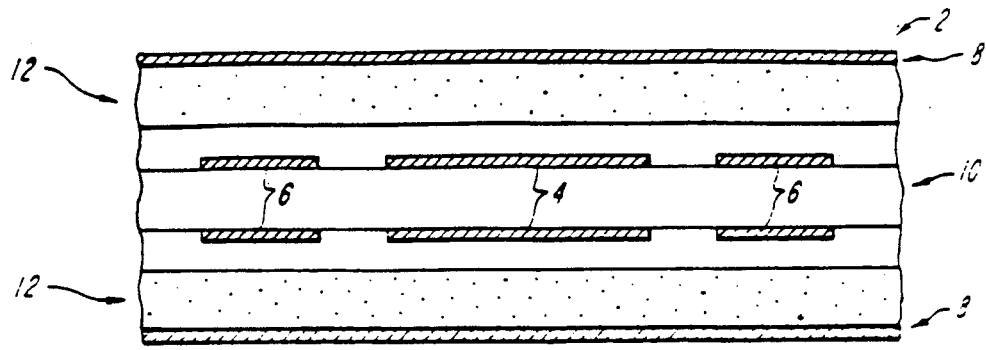

In some applications, it is desirable to minimize the thickness of the MUT. This can be achieved by trapping the MUT between two planes. In order to minimize space, the electrode pair can be disposed on one plane and the shunting electrode can be disposed opposite the electrode pair on a parallel plane. In particular, the planes can be curved. In one embodiment, illustrated in FIG. 12a, the planes are concentric cylinders. A cross-sectional view of this sensor configuration is shown in FIG. 12b. In the embodiment depicted, the driven and sensing electrodes are disposed on the inner cyclinder whereas the shunting electrode forms the outer cylinder. The electrode pair and the shunting electrode can be interchanged in this configuration.

The embodiment of FIG. 12 is particularly appropriate for applications in which the sensor is to be immersed in the MUT, which fills the annulus between the concentric cylinders. In this way, the thickness of the MUT is fixed by the radii of the cylinders. Thus the ratio b/w can be optimized.

Electrical Measurements

Figure 13:
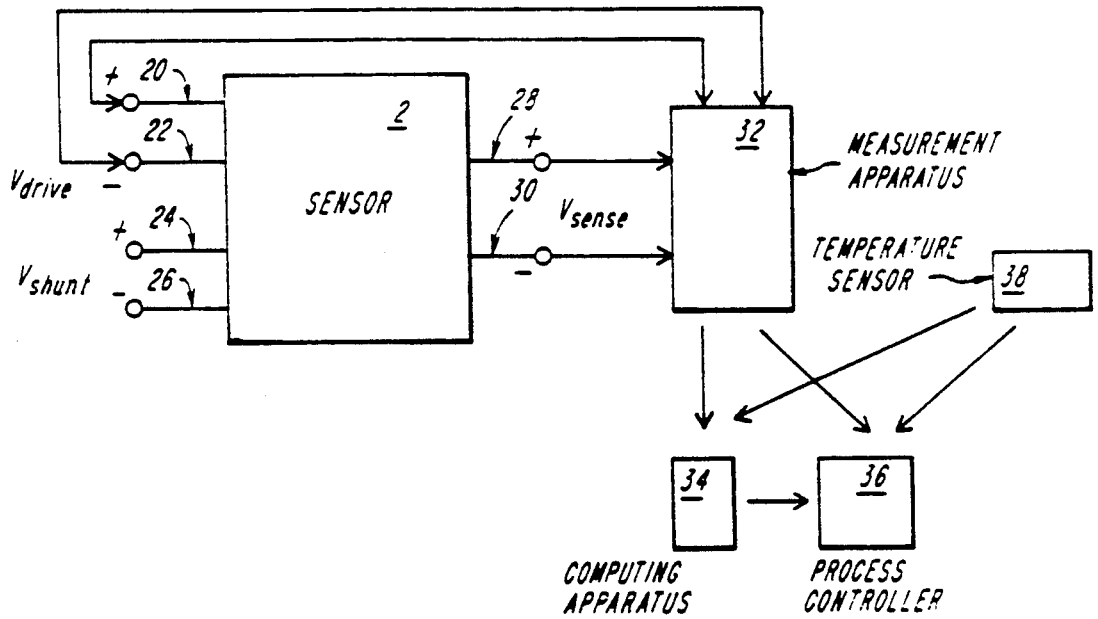
FIG. 13 is a schematic block diagram of a system employing a dielectric sensor of the present invention.

A general configuration for an electrical measurement using the sensor of the invention is shown in FIG. 13. The driving signal is applied between terminals 20 and 22, the shunting signal is applied between terminals 24 and 26, and the sensed signal is measured between terminals 28 and 30. The apparatus for supplying the driving and shunting signals are not shown. Typically the terminals 22, 24, 26, and 30 are at signal ground. Note that these terminals are not necessarily part of the electrode structure since the ground plane may not exist in the sensor and the shunting electrode may not be at ground potential.

The measurement apparatus 32 is preferably an RC bridge or meter which can be configured to measure a four-terminal device. Appropriate instruments are the Model 4275 bridge produced by Hewlett-Packard or similar models produced by GenRad.

The output of the measurement apparatus 32 may be sent to a computing apparatus 34 which is programmed to compute dielectric or geometric properties of interest from the terminal electrical measurements by methods discussed hereinbelow. Alternatively, in some embodiments, the output of the measurement apparatus 32 may be sent directly to a process controller 36 which uses the measurements to control a process involving the MUT.

In preferred embodiments, the apparatus further includes a temperature sensor 38, such as a thermocouple, for measuring the temperature of the MUT. The temperature sensor may be fabricated as an integral part of the sensor or may be realized as a separate element. The temperature sensor can be important in some applications since the material properties of interest are temperature dependent. The temperature measured by temperature sensor 38 acts as an input to the computing apparatus 34 or process controller 36 to calibrate the measurements and to account for temperature fluctuations.

Figure 14A:
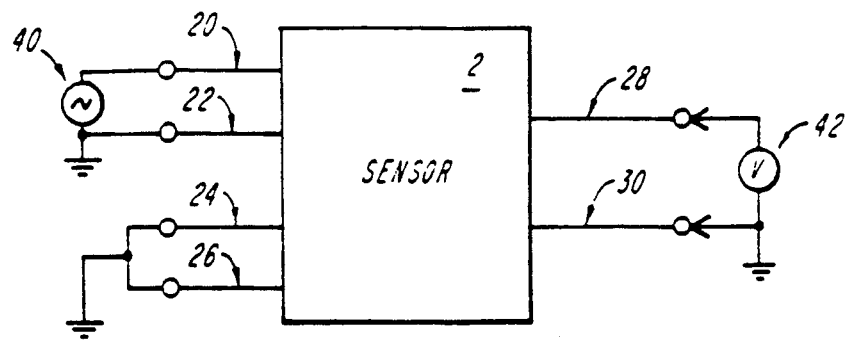
FIGS. 14a, 14b, and 14c are schematic diagrams of the sensor used in various measurement scenarios.
Figure 14B:
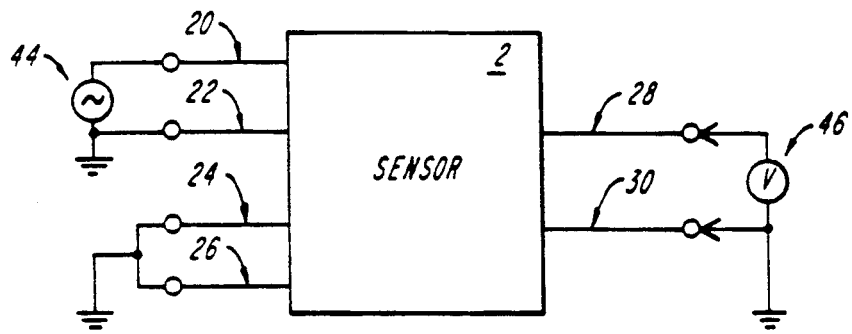
Figure 14C:
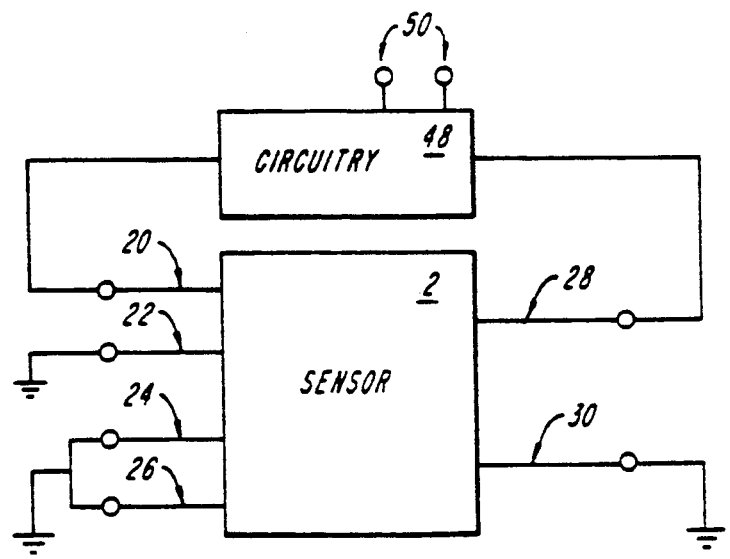

Several different types of measurements can provide the information required to determine parameters such as the MUT permittivity, conductivity and dielectric loss, thickness, and the proximity of the sensor with respect to the MUT, as illustrated by way of example in FIG. 14. Conceptually, in the measurement of complex transfer admittance, an AC voltage with respect to ground is applied to the driven electrode via source 40, and the signal is measured at the sensing electrode in the form of a short circuit current with ammeter 42, as illustrated in FIG. 14a. In the measurement of a complex gain, an AC voltage with respect to ground is applied to the driven electrode via source 44, and the signal is measured at the sensing electrode in the form of an open circuit voltage with voltmeter 46, as illustrated in FIG. 14b. In a resonant circuit measurement, the sensor is made a part of an RLC circuit with the addition of circuitry 48, as illustrated in FIG. 14c. The circuitry 48 may include only an inductance (as the sensor has resistance and capacitance), or it may include further resistors and/or capacitors for tuning the response. The parameters measured at a set of terminals 50 preferably include the resonant frequency and the Q factor.

There are other measurement methods known to those skilled in the art which can be used to practice the methods described herein.

Models of Sensor Response

In the preferred embodiment, the degree of shunting experienced by the sensing electrode is directly affected by the dielectric and the geometric properties of the MUT. Thus, it is possible to directly infer these properties from terminal electrical measurements. This process requires accurate modeling of the sensor response to the dielectric properties and thickness of the material. This modeling is similar to that used to measure continuum properties from interdigital electrode dielectrometry (see Zaretsky et al.). Parameter estimation techniques then allow for the deconvolution process that yields the parameters of interest. The proximity of the material to the electrodes can be also estimated in the model. The proximity of a grounded plane to the plane of the electrodes can also be modeled using the same techniques described above and can therefore be estimated from the terminal measurements. All of these properties can be estimated directly from the terminal measurements using a descriptive model of the electrical behavior of the sensor. No calibration is thus required in this process.

The electric field in the structure described in FIG. 8 is modeled as being quasistatic and independent of the coordinate describing the depth of the sensor. For the latter condition to hold it is required that the depth d of the sensor be much greater than the characteristic width w of the electrodes.

$$d >> w$$

The electroquasistatic approximation is satisfied by requiring that the wavelength of the electromagnetic wave be much larger than the characteristic length of the structure. This condition thus requires that the excitation frequency f be low enough that $$f << \frac{c}{d}$$

where c is the speed of light ($3 \times 10^8$ m/s). For a worse case in which the length of the electrodes is 1 m, the excitation frequency is required to be below 300 MHz. For the frequency range of interest (f<10 MHz) the losses in the MUT are assumed to be dominated by conduction. Dielectric losses which typically occur at much higher frequencies are assumed to be insignificant. For example, the dipolar losses in water become significant only at frequencies above 1 GHz.

Lumped-Parameter Model

Figure 15A:
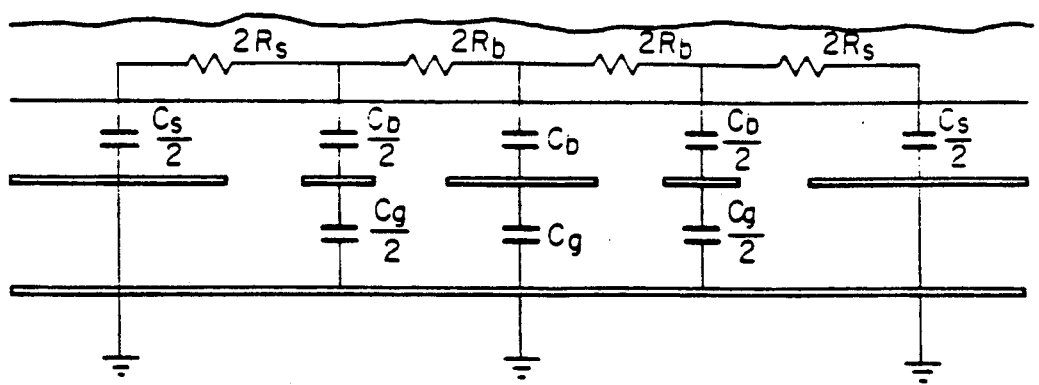
FIGS. 15a, 15b, 15c, and 15d are circuit diagrams of a lumped-parameter model for the dielectric sensor illustrated in FIG. 8.
Figure 15B:
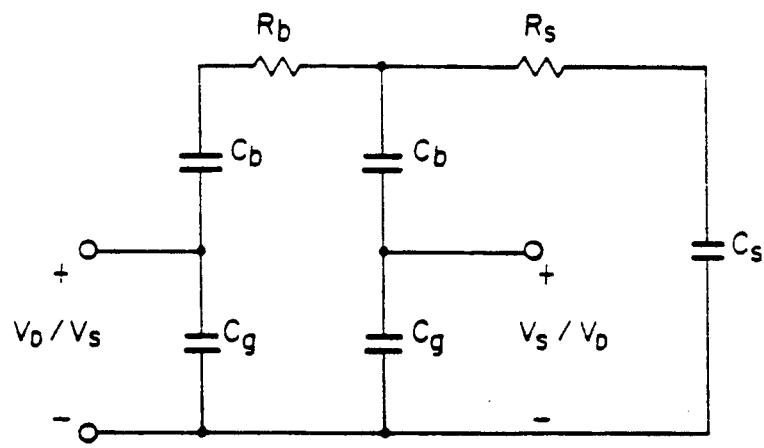

A lumped-parameter model is presented to describe the response of the sensor to a thin layer of MUT and to demonstrate the dominant features. This model is subject to the assumptions made in the description below. The distributed lumped parameters are illustrated in FIG. 15a. The resulting equivalent circuit is shown in FIG. 15b. What follows is an attempt to estimate the values of the circuit elements.

Starting from the driven electrode there is a capacitance coupling this electrode to the ground plane through the substrate. Assuming that the thickness h of the substrate is thin compared with the width 2w of the electrode, the capacitance $C_g$ can be estimated to be that of a parallel plate structure $$C_g \approx 2 \frac{\epsilon_s d}{h/w}$$

where d is the length of the electrodes. Because the width of the sensing electrodes is half that of the driven electrode, the same capacitance couples the sensing electrodes to the lower ground plane.

The coupling between the driven and the sensing electrodes can be thought of as a series combination of a capacitance between the sensing electrode and the MUT, a resistance, and the same capacitance between the MUT and the driven electrode. The MUT is modeled purely as a resistance because the frequency of excitation (1 MHz) is low compared with the reciprocal of the electrical relaxation time of the MUT. For salt water with a typical conductivity $\sigma$ of 1 S/m and a relative permittivity $\epsilon/\epsilon_o$ of 80, this is demonstrated by the following dimensionless quantity.

$$\omega \tau_e = 0.004 \ll 1$$

where the frequency $\omega$ and the electrical relaxation time $\tau_e$ are defined as $$\omega = 2\pi f$$

$$\tau_e = \frac{\epsilon}{\sigma}$$

This assumption is thus valid for MUTs with a conductivity greater than 0.05 S/m. In this limit, the resistance can be approximated as if the electric field is contained by the MUT and uniformly distributed throughout its thickness b. With the length of the electrodes taken as 2w, the parallel combination of the resistances gives $$R_b \approx \frac{1}{\sigma d(b/\omega)}$$

Assuming that the thickness a of the base is small compared with the width of the electrodes, the capacitance between the electrodes and the MUT can be approximated to be that of a parallel structure.

$$C_b \approx 2 \frac{\epsilon_b d}{a/\omega}$$

Of particular interest is the coupling from the sensing to the shunting electrode. This consists of the resistance of the MUT in series with the capacitance from the MUT to the shunting electrode. With the conduction path length assumed to be the distance between the center of the electrodes, the parallel combination of the resistances can be estimated to be $$R_s \approx \frac{3 + l/\omega}{4\sigma d(b/\omega)}$$

The coupling capacitance is the parallel combination of two parallel-plate structures with the area of the shunting electrode as the surface area and the thickness of the base as the separation.

$$C_s \approx 2\epsilon_b d \frac{l/\omega}{a/\omega}$$

It is this coupling that dominates the response of the sensor to the MUT.

Figure 15C:
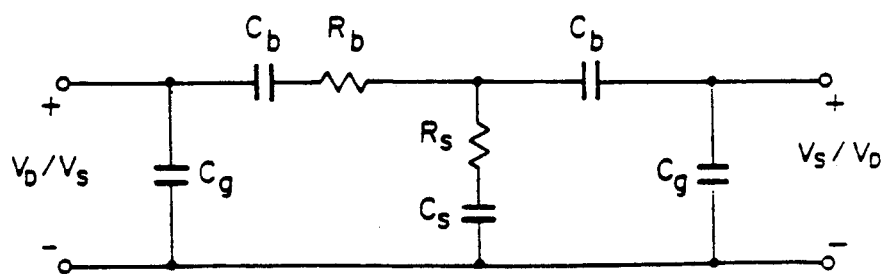

If the electrodes are unraveled so that the terminals are located at the extremes, the resulting equivalent circuit is as shown in FIG. 15c.

Figure 15D:
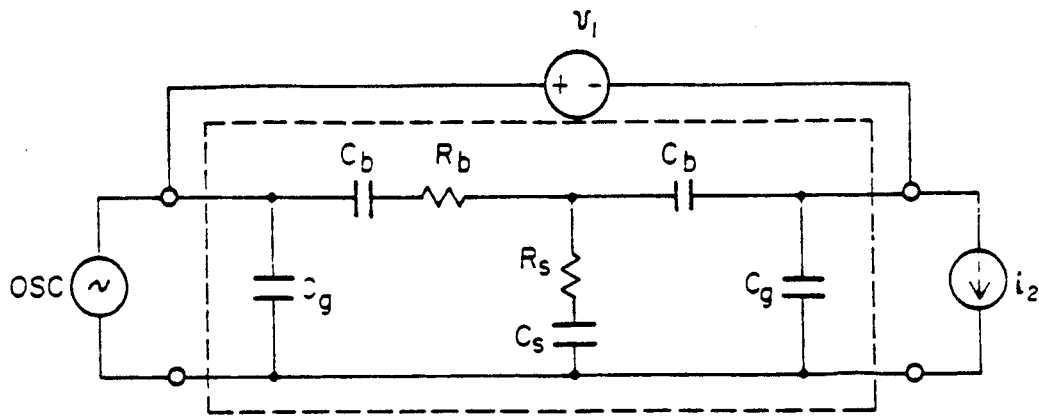

The AC measurement of the capacitance and loss of the sensor can be made with the four-terminal measurement system shown in FIG. 15d. Because the ammeter is at virtual ground, the ratio of the measured current $i_2$ to the excitation voltage $v_1$ gives an estimate of the complex transfer admittance, $$\hat{Y}_{21} = \frac{\hat{i}_2}{\hat{v}_1}\bigg|_{\hat{v}_2=0} = G + j\omega C$$

where G and C are the corresponding measured loss and capacitance values.

This admittance can be easily computed in terms of the circuit elements using frequency-domain techniques (see *Circuits, Signals, and Systems* by W. M. Siebert, MIT Press, Cambridge, Mass., 1986, Section 2.5).

$$\hat{Y}_{21} = \frac{j\omega C_b}{2 + j\omega R_b C_b + \frac{C_s}{C_b}\left[\frac{1 + j\omega R_b C_b}{1 + j\omega R_s C_s}\right]}$$

The values of the loss and capacitance can then be expressed in terms of the complex transfer admittance.

$$G = Re(\hat{Y}_{21})$$

$$C = Im(\hat{Y}_{21})/\omega$$

In the absence of a shunting electrode in the plane of the driven and sensing electrodes, the coupling described by the resistance $R_s$ and the capacitance $C_s$ does not occur and the transfer admittance reduces to $$\hat{Y}_{21} = \frac{j\omega C_b}{2 + j\omega R_b C_b}$$

To understand the role of the shunting electrode it is important to compute the RC time constants contained in the expressions for the complex transfer admittance. The coupling between the driven and sensing electrodes is described by the time constant $$R_b C_b = 2\left(\frac{1}{a/\omega}\right)\left(\frac{1}{b/\omega}\right)\left(\frac{\epsilon_b}{\sigma}\right)$$

whereas the coupling to the shunting electrode can be similarly expressed as $$R_s C_s = \frac{1}{2}\left(\frac{1}{a/\omega}\right)\left(\frac{1}{b/\omega}\right)\left(\frac{\epsilon_b}{\sigma}\right)\left(\frac{l}{\omega}\right)\left(\frac{l}{\omega} + 3\right)$$

Comparison of these two expressions indicates that, if the width of the shunting electrode is much greater than the width of the driven and sensing electrodes, the second time constant is much greater than the first one and the coupling to the shunting electrode dominates the coupling between the driven and sensing electrodes. This implies that with a shunting electrode, a much lower frequency can be used to obtain a signal that is sensitive to the conduction losses of the MUT. This feature makes the apparatus unique. For conducting MUTs this sensor provides a way of making non-invasive measurements of the conductivity of the MUT at frequencies that are orders of magnitude smaller than would otherwise be required in the absence of a shunting electrode. According to the model, at these low frequencies the response of the sensor would be insensitive to the permittivity of the MUT. This is demonstrated by the fact that this quantity does not appear in the expression of the complex transfer admittance. The performance of the sensor is further illustrated by examining its response to changes in the properties of the MUT.

Figure 16A:
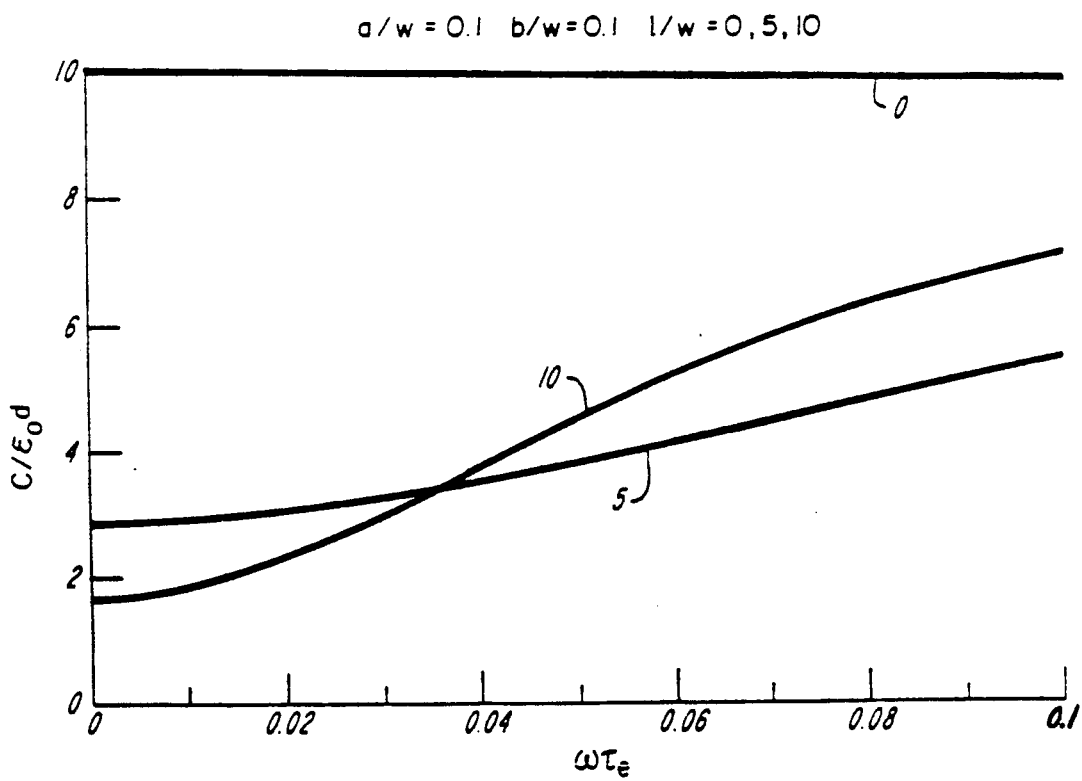
FIGS. 16a and 16b are plots illustrating normalized complex transfer admittance as a function of $\omega\tau_e$ and $l/w$ as predicted by the lumped-parameter model.
Figure 16B:
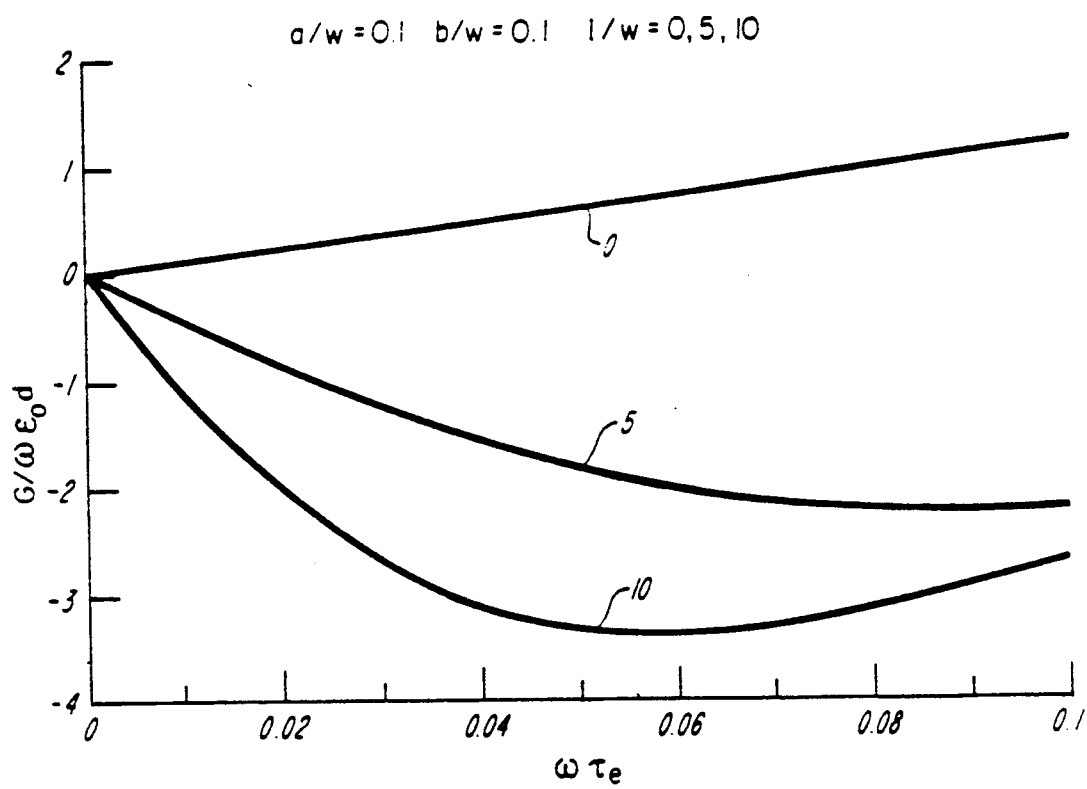

Using the expression for the complex transfer admittance it is possible to compute the capacitance and loss as a function of the parameters. Of particular interest is the response of the sensor to changes in the conductivity of the MUT. These changes may be affected by changing the concentration of a solute in a solvent. A plot of the normalized capacitance and loss as a function of the relaxation time normalized to the frequency of excitation is shown in FIG. 16. The width of the shunting electrode is varied as a parameter. The capacitance is normalized to the permittivity of free space ($\epsilon_o = 8.854 \times 10^{-12}$ F/m) and the length d of the electrodes. The loss is normalized to the same two parameters and the frequency of excitation, $\omega$. Because the relaxation time is normalized to the frequency of excitation, the parameter being varied can be thought of either as the inverse of the conductivity or the frequency.

The selected ratios of lengths are not necessarily representative but serve as a basis of comparison and are within the assumed limits specified in the lumped-parameter model. The l=0 curve is drawn for the case in which the shunting electrode is absent from the apparatus. The other curves show the performance of the sensor in the presence of a shunting electrode. The plot indicates that without a shunting electrode, the capacitance is essentially constant and that the loss increases linearly as a function of the normalized relaxation time. With a shunting electrode, the response changes considerably. The low frequency capacitance is significantly lower and increases with increasing relaxation time. The loss, on the other hand, decreases from zero and appears to have a peak which shifts toward lower frequencies as the width of the shunting electrode is increased. The fact that the loss is negative is an indication that the measured current at the sensing electrode is out of phase with the excitation voltage at the driven electrode and should not be associated with a negative resistance. The frequency shift is a demonstration of the RC time constant introduced by the shunting electrode. It appears therefore that by adjusting the width of the shunting electrode, the frequency at which the peak occurs decreases and the slope increases. This allows for measurements to be made at lower frequencies with greater sensitivity.

Figure 17A:
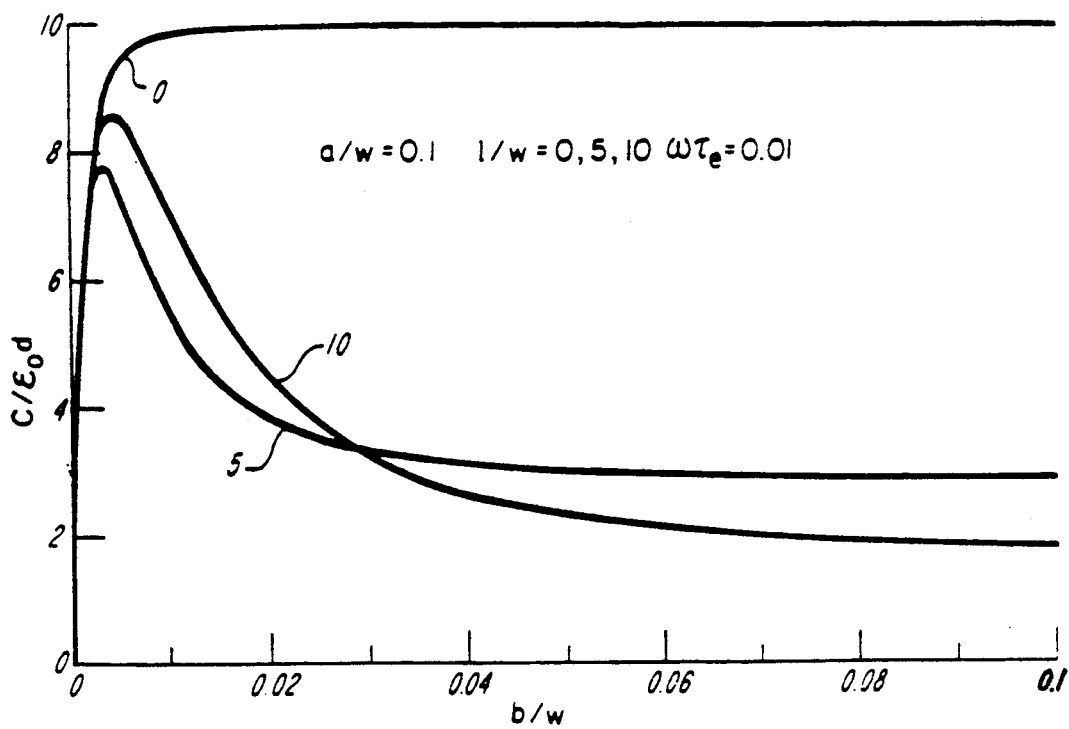
FIGS. 17a and 17b are plots illustrating normalized complex transfer admittance as a function of $b/w$ and $l/w$ as predicted by the lumped-parameter model.
Figure 17B:
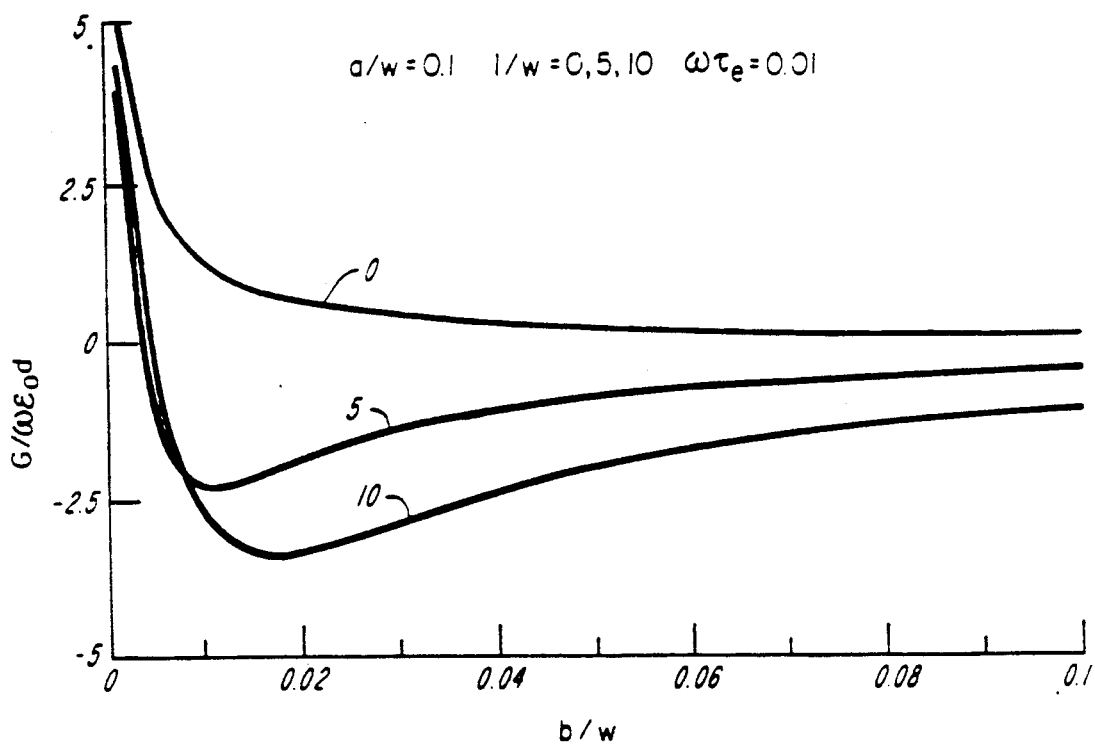

The same effect is observed in a plot of the capacitance and loss as a function of the thickness of the MUT. This plot is illustrated in FIG. 17 where the normalized capacitance and loss are plotted as a function of the thickness of the MUT normalized to the width of the driven electrode. As the width of the shunting electrode is increased, the sensitivity of the sensor to changes in the thickness of the MUT is not only enhanced for small thicknesses but the range of sensitivity is also increased over that offered by an apparatus without a shunting electrode. The width of the shunting electrode can thus be adjusted to provide optimum performance in the region of interest.

Figure 18:
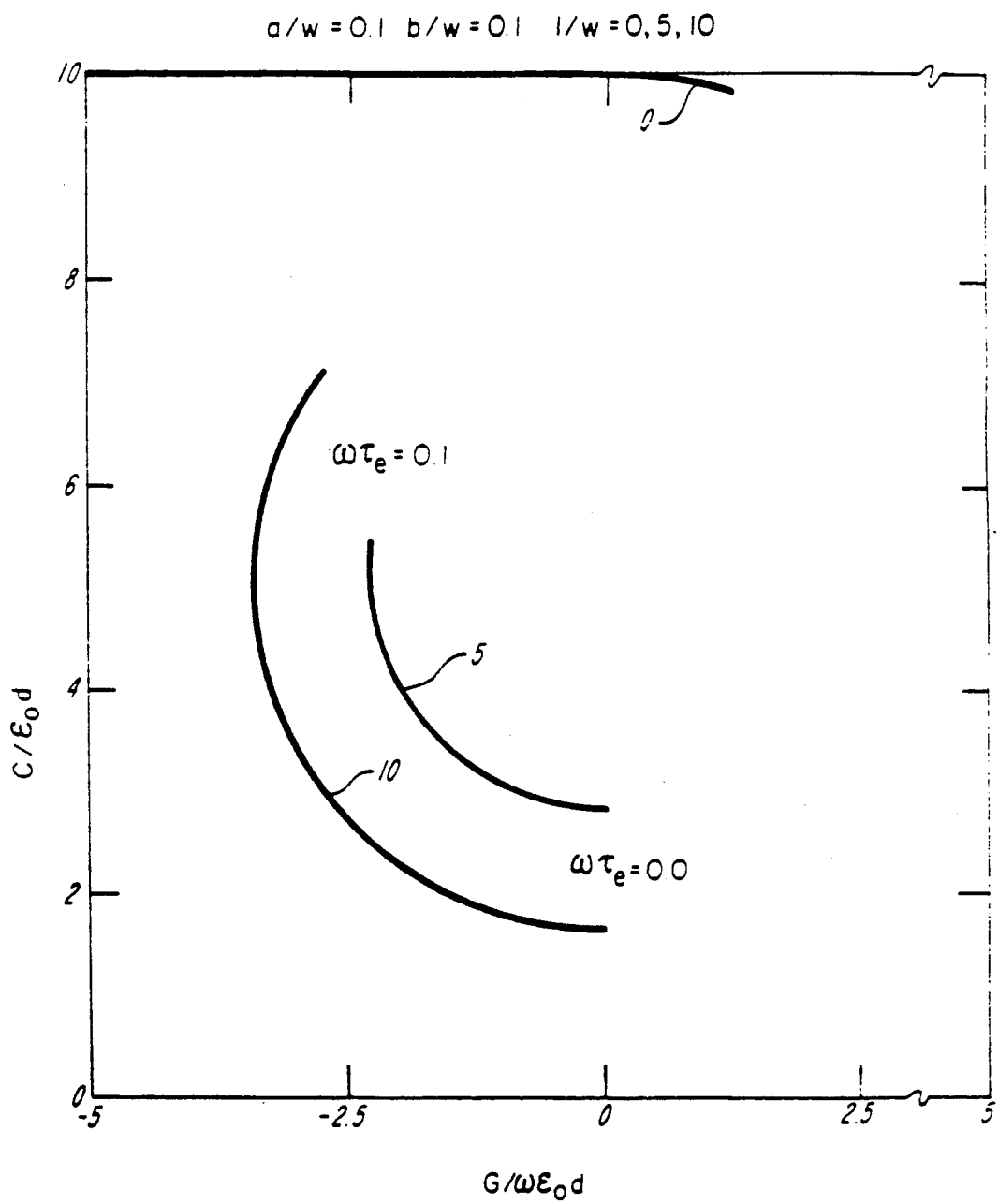
FIG. 18 is a polar plot illustrating normalized complex transfer admittance as a function of $\omega\tau_e$ and $l/w$ as predicted by the lumped-parameter model.
Figure 19:
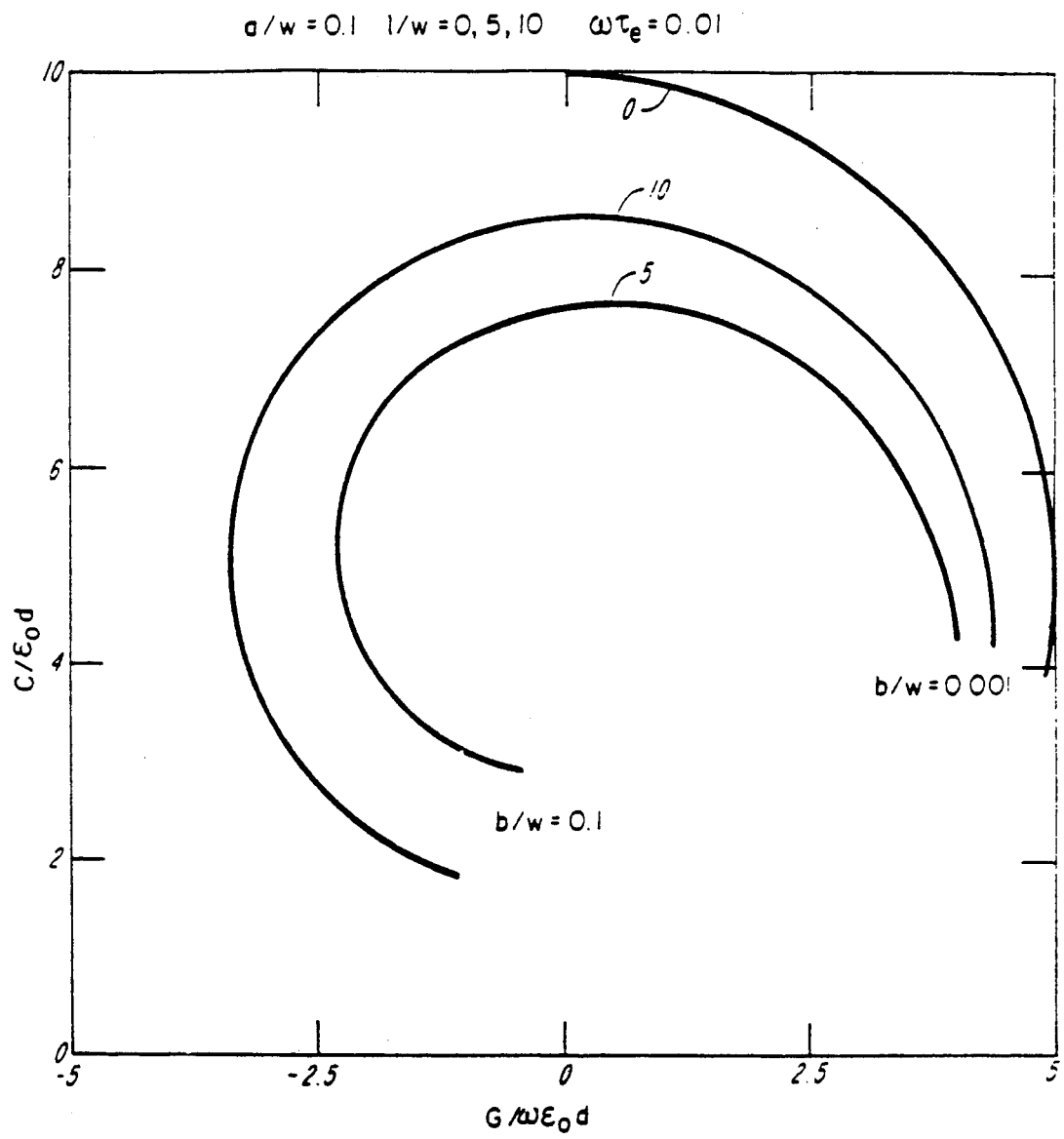
FIG. 19 is a polar plot illustrating normalized complex transfer admittance as a function of $b/w$ and $l/w$ as predicted by the lumped-parameter model.

Curves generated empirically or through an accurate model can be used to infer the dielectric and geometric properties of the MUT. It appears that the double-valued nature of the loss characteristics can provide limits on the parameter estimation process. Polar plots of the normalized capacitance and loss for FIGS. 16 and 17 are shown in FIGS. 18 and 19. These plots clearly illustrate the uniqueness of each set of measurements with respect to the parameter being varied. If a curve were to close on itself, the point of intersection would represent a condition in which two parameter values result in the same set of measurements. Note that these plots only provide information about the estimation of a single parameter from the measurement of the capacitance and loss.

Figure 20A:
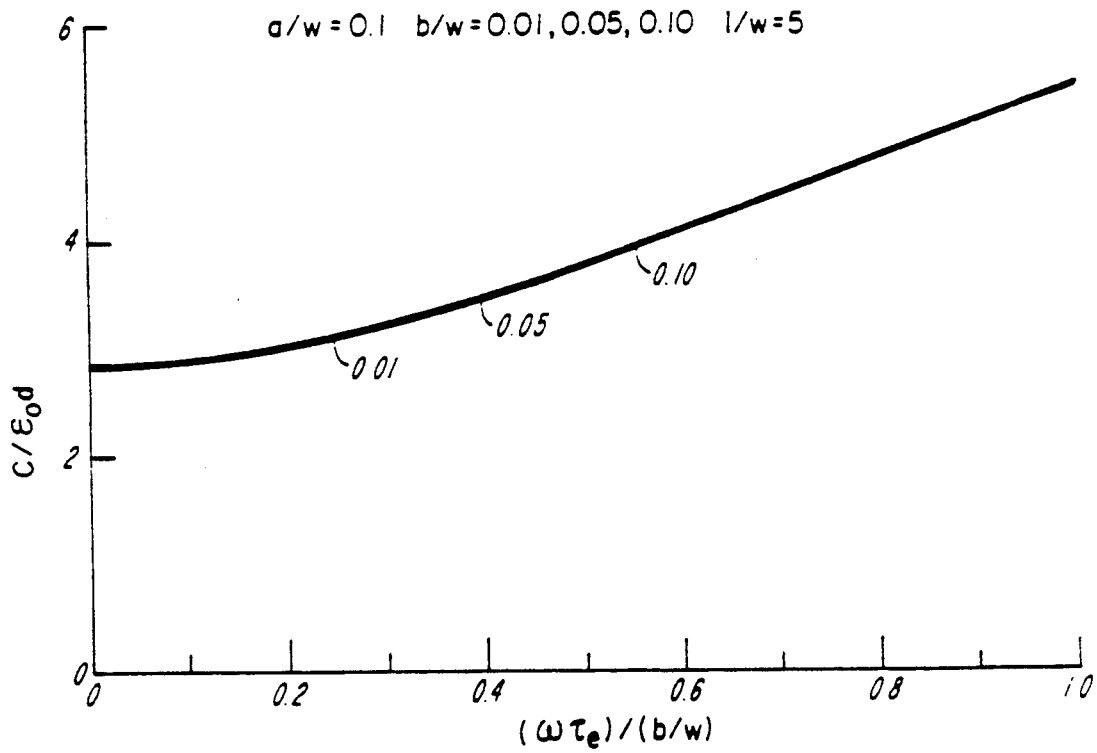
FIGS. 20a and 20b are plots illustrating normalized complex transfer admittance as a function of $(\omega\tau_e)/(b/w)$ and $b/w$ as predicted by the lumped parameter model.
Figure 20B:
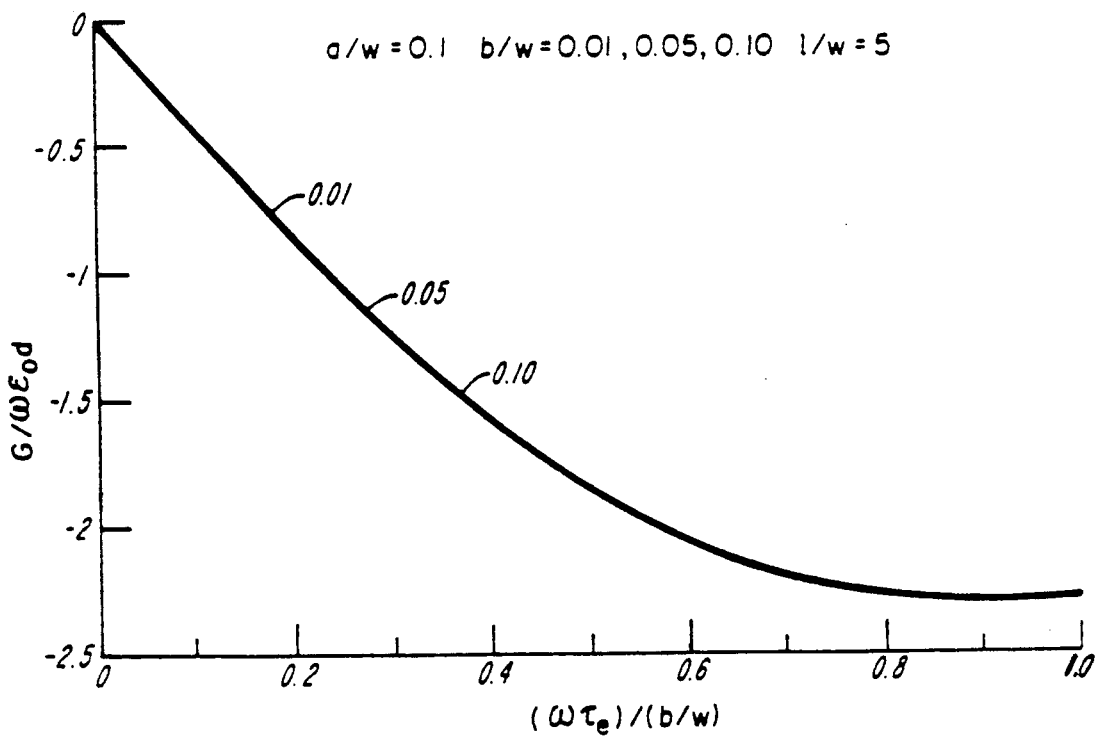

In this parameter range the measurement of the conductivity and the thickness of the MUT are not independent from each other. This behavior can be observed from the polar plots which when superimposed give the same curve. In addition, if the capacitance and loss are plotted as a function of the ratio of the normalized relaxation time to the normalized thickness of the MUT, the response is the same for three different values of the thickness of the MUT. This is illustrated in FIG. 20. Because the three curves cannot be differentiated from each other the conductivity and thickness of the MUT cannot be estimated independently. The fact that the complex transfer admittance depends on the resistance of the MUT, which is inversely proportional to the product of the conductivity and the thickness, is proof of this behavior. This means that over the range considered, only one parameter can be estimated from a set of measurements. Both parameters may be obtained from a measurement of the MUT in two different configurations. For example, the conductivity of the MUT may be measured in a region in which the thickness is large compared with the width of the driven electrode. Once the conductivity is known the thickness of the MUT in a separate region may be estimated from a second measurement. Because the thickness of the MUT is required to be thick compared with the width of the electrodes, this two-stage estimation process motivates the development of a model in which the limits imposed by the lumped-parameter model are relaxed.

Continuum Model

With the goal of investigating the response of the sensor beyond the limits imposed by the lumped-parameter model, a continuum model is presented along with the characteristic responses. The piece-wise uniform distribution of materials above the plane of the electrodes can be described in terms of a surface capacitance density (see Zaretsky et al.). Thus, given the thickness and dielectric properties of each layer in the semi-infinite half-space, the surface capacitance density can be evaluated using transfer relations for the electrical variables (see *Continuum Electromechanics* by J. R. Melcher, MIT Press, Cambridge, Mass., 1981, Section 2.16).

The surface capacitance density represents the response of the system to a single spatial mode. The superposition of all the modes of a Fourier series or Fourier transform gives the response of the structure. What is then required is a description of the potential at the surface of the electrodes. The solution of the required potential distribution would result from a mixed-boundary value problem (see Zaretsky et al.). In a numerical approach, the potential between the electrodes would be approximated by piece-wise continuous linear segments between collocation points. The value of the potential at these discrete points would then be found by taking the inverse of a matrix obtained by applying the integral form of charge conservation between the collocation points. Here for simplicity, it is assumed that the potential between the electrodes varies linearly. To the degree that this distribution describes the actual potential between the electrodes, this model is approximate. In the description of the potential, the role of the driven and sensing electrodes is reversed. In addition, the electric field is assumed to be purely tangential to the outer edge of the apparatus such that the potential distribution on the plane of the electrodes can be described by a Fourier series.

$$\frac{\hat{\Phi}(x)}{\hat{v}} = \left(\frac{2}{4 + l/\omega}\right)\left[1 - \sum_{n=1}^{\infty} A_n \cos k_n x\right]$$

The wavenumber for each mode is defined by $$k_n \omega = \frac{n\pi}{4 + l/\omega}$$

and the Fourier coefficients are given by $$A_n = \frac{1}{(k_n \omega)^2} [\cos k_n \omega - \cos 2k_n \omega - \cos 3k_n \omega + \cos 4k_n \omega]$$

In the absence of the shunting electrode the potential distribution has the form $$\frac{\hat{\Phi}(x)}{\hat{v}} = \frac{1}{2}\left[1 - \sum_{n=1}^{\infty} B_n \cos k_n x\right]$$

with the wavenumber for each mode defined by $$k_n \omega = \frac{n\pi}{3}$$

and the Fourier coefficients given by the expression $$B_n = \frac{4}{3} \frac{1}{(k_n \omega)^2} [\cos k_n \omega - \cos 2k_n \omega]$$

With the base material taken as insulating, conservation of charge at the sensing electrode relates the measured current to the normal electric field so that the normalized complex transfer admittance can be expressed as $$\frac{\hat{Y}_{12}}{\omega \epsilon_o d} = -2j \left(\frac{\epsilon_b}{\epsilon_o}\right) \int_0^\omega \frac{\hat{E}_y}{\hat{v}} dx$$

Because the surface capacitance density relates the normal component of the electric displacement and the potential, $$\hat{C}_n = \frac{\hat{D}_n}{\hat{\Phi}_n} = \frac{\epsilon_b \hat{E}_n}{\hat{\Phi}_n}$$

the transfer admittance can be expressed in terms of the surface capacitance density and the potential of each mode.

$$\frac{\hat{Y}_{12}}{\omega \epsilon_o d} = -2j \sum_{n=1}^{\infty} \frac{\hat{C}_n^a}{\epsilon_o} \int_0^\omega \frac{\hat{\Phi}_n}{\hat{v}} dx$$

Using the expression for the potential distribution described above, the complex transfer admittance can be expressed in terms of the Fourier coefficients $$\frac{\hat{Y}_{12}}{\omega \epsilon_o d} = 2j \left(\frac{2}{4 + l/\omega}\right) \sum_{n=1}^{\infty} \left(\frac{\hat{C}_n^a}{\epsilon_o k_n}\right) A_n \sin k_n \omega$$

where the normalized surface capacitance density can be obtained using transfer relations for the homogeneous layers (see Melcher).

$$\frac{\hat{C}_n^a}{\epsilon_o k_n} = (\epsilon_b/\epsilon_o)\coth k_n a - \frac{(\epsilon_b/\epsilon_o)^2/\sinh^2 k_n a}{\left(\frac{\hat{C}_n^b}{\epsilon_o k_n}\right) + (\epsilon_b/\epsilon_o)\coth k_n a}$$

and $$\frac{\hat{C}_n^b}{\epsilon_o k_n} = (\epsilon^*/\epsilon_o)\coth k_n b - \frac{(\epsilon^*/\epsilon_o)^2/\sinh^2 k_n b}{1 + (\epsilon^*/\epsilon_o)\coth k_n b}$$

with the complex dielectric constant of the MUT defined by $$\frac{\epsilon^*}{\epsilon_o} = \left(\frac{\epsilon}{\epsilon_o}\right)\left[1 - j\frac{1}{\omega \tau_e}\right]$$

In the absence of a shunting electrode the complex transfer admittance can also be expressed in terms of the Fourier coefficients and the normalized surface capacitance density.

$$\frac{\hat{Y}_{12}}{\omega \epsilon_o d} = j \sum_{n=1}^{\infty} \left(\frac{\hat{C}_n^a}{\epsilon_o k_n}\right) B_n \sin k_n \omega$$

Figure 21A:
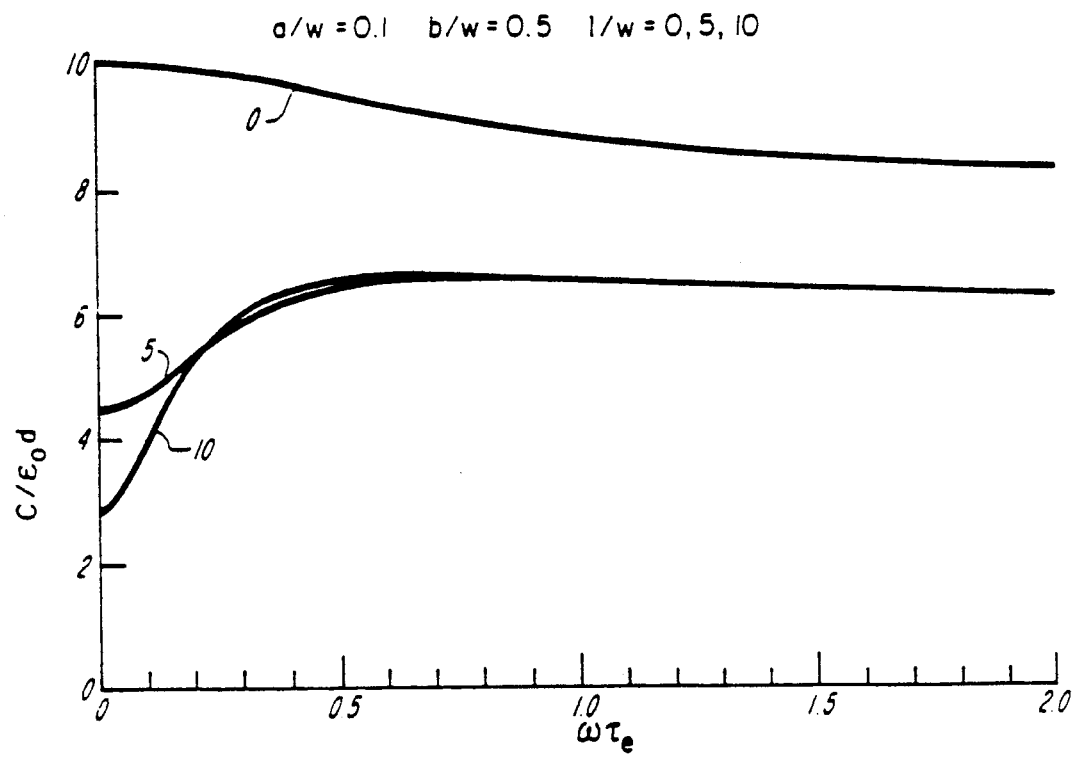
FIGS. 21a and 21b are plots illustrating normalized complex transfer admittance as a function of $\omega\tau_e$ and $l/w$ as predicted by the continuum model.
Figure 21B:
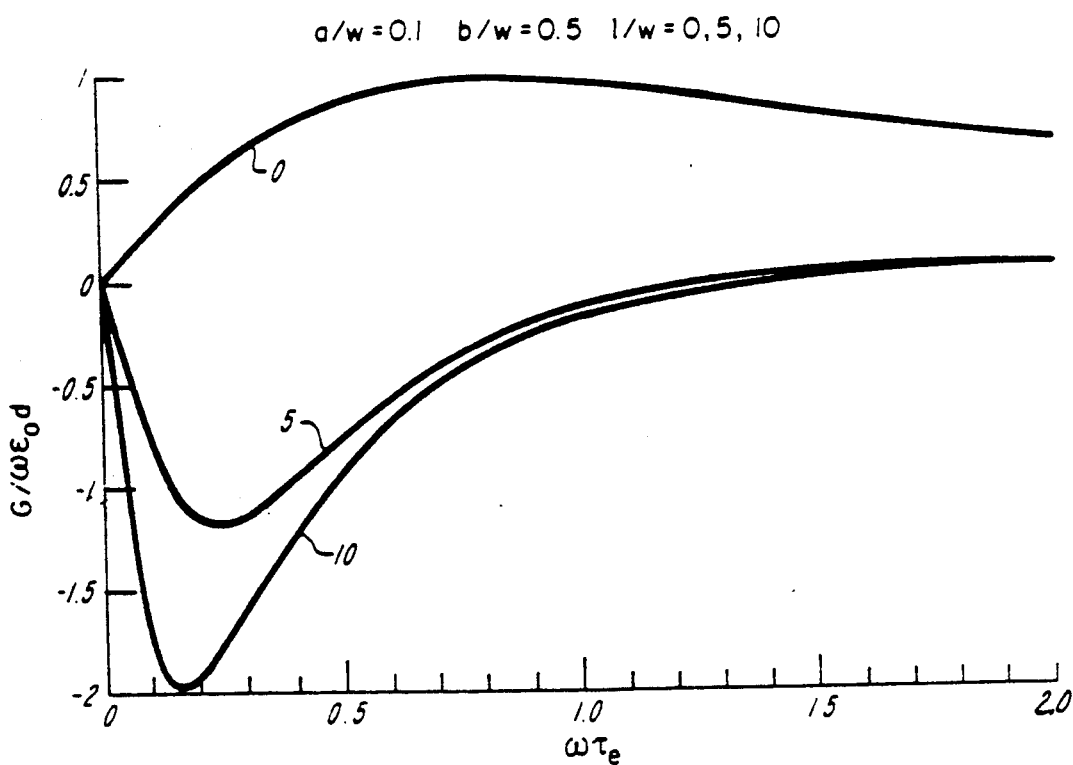

Using the expressions for the complex transfer admittance, the response of the sensor was computed as a function of the normalized relaxation time with the width of the shunting electrode as a parameter. The response was computed for the same sensor parameters used in the lumped-parameter model but for a thicker layer of MUT. The normalized capacitance and loss are plotted in FIG. 21. The same characteristic response is observed here for low values of the normalized relaxation time. An increase of the width of the shunting electrode leads to an increase in the sensitivity in the response. The frequency at which the peak loss occurs decreases as the width of the shunting electrode is increased. This figure provides additional information because it is not subject to the same assumptions made in the lumped-parameter model. It illustrates the behavior of the sensor for higher values of the normalized relaxation time. As the value approaches unity the difference between the two structures with the shunting electrode is reduced.

Figure 22A:
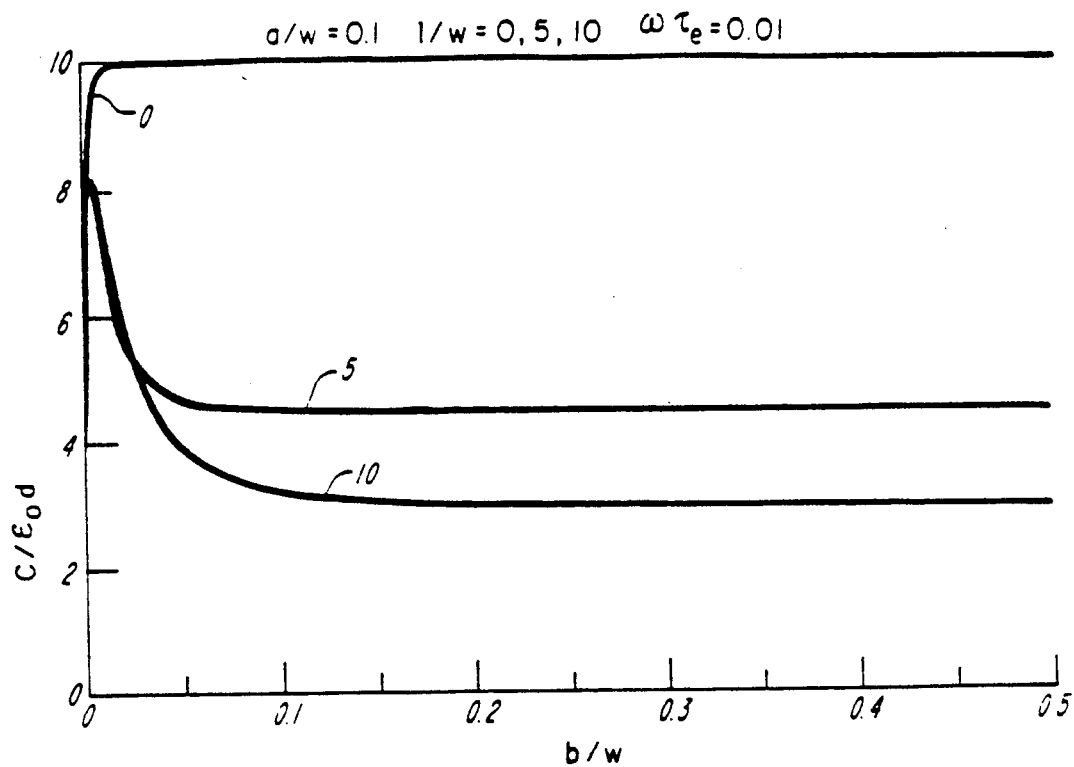
FIGS. 22a and 22b are plots illustrating normalized complex transfer admittance as a function of $b/w$ and $l/w$ as predicted by the continuum model.
Figure 22B:
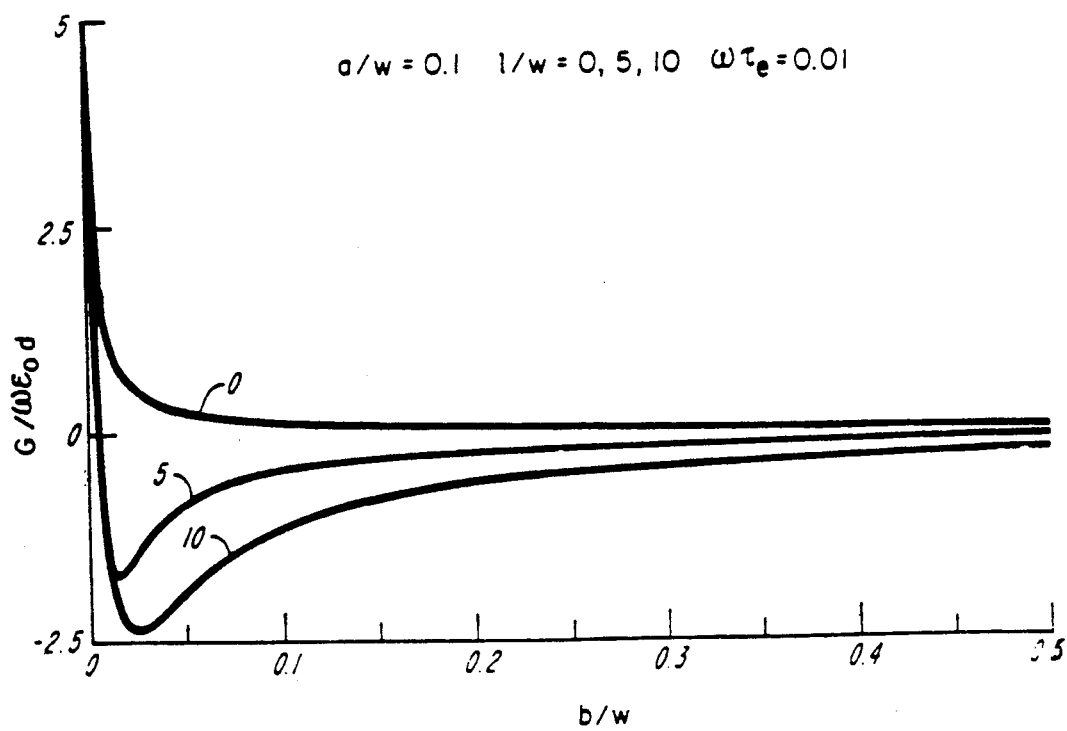

Just as in the lumped-parameter model, the response of the sensor to changes in the thickness of the MUT in enhanced by the presence of the shunting electrode. This behavior is shown in FIG. 22. This figures shows that for small values of the normalized thickness, the sensor provides grater sensitivity as the width of the shunting electrode is increased. In addition, the range of sensitivity is increased over that observed in the absence of such an electrode. In fact, for MUT thicknesses comparable with the width of the electrodes, the sensitivity of the apparatus, however small, is still significant compared with that exhibited by an apparatus without the shunting electrode.

Figure 23:
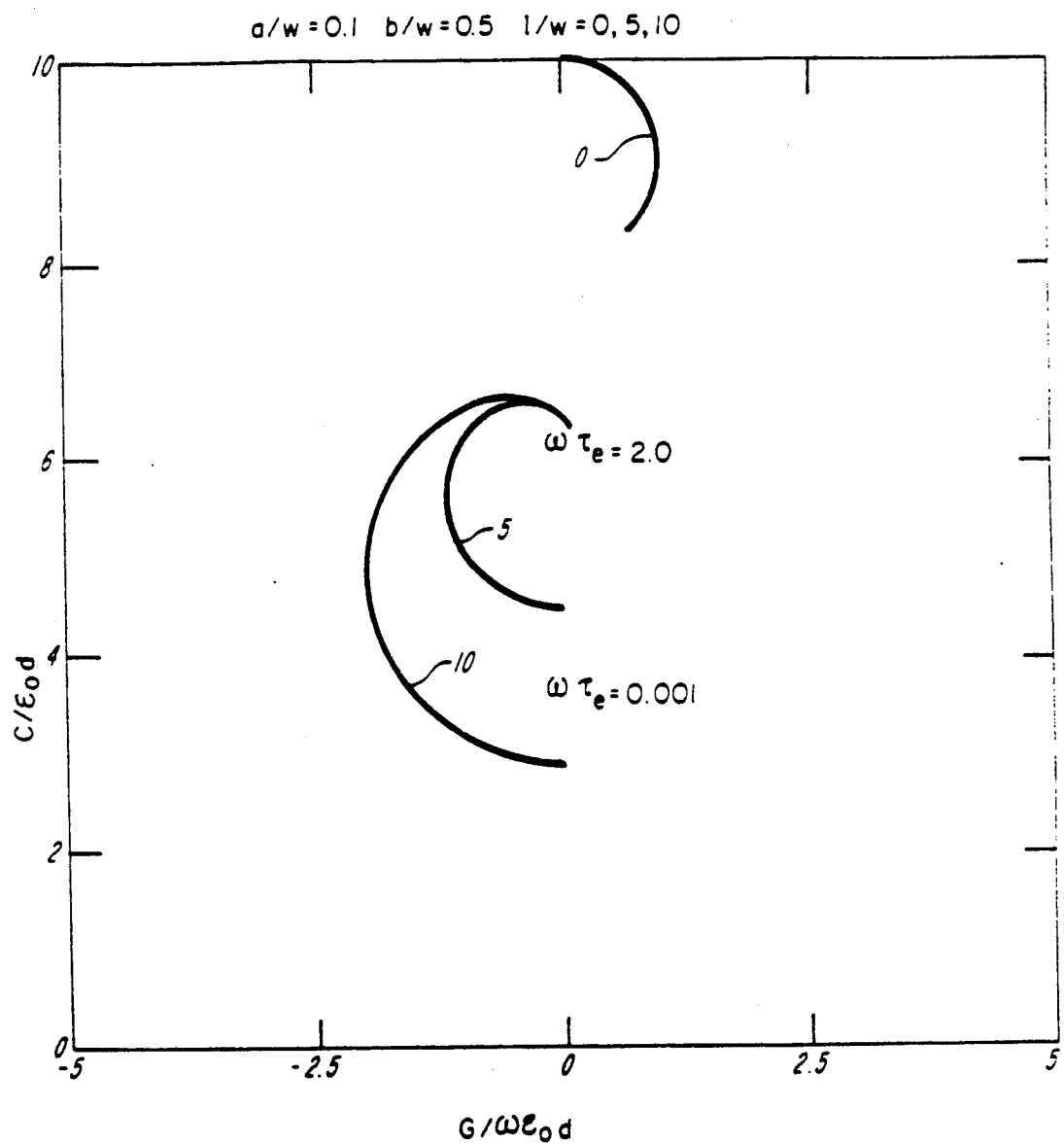
FIG. 23 is a polar plot illustrating normalized complex transfer admittance as a function of $\omega\tau_e$ and $l/w$ as predicted by the continuum model.
Figure 24:
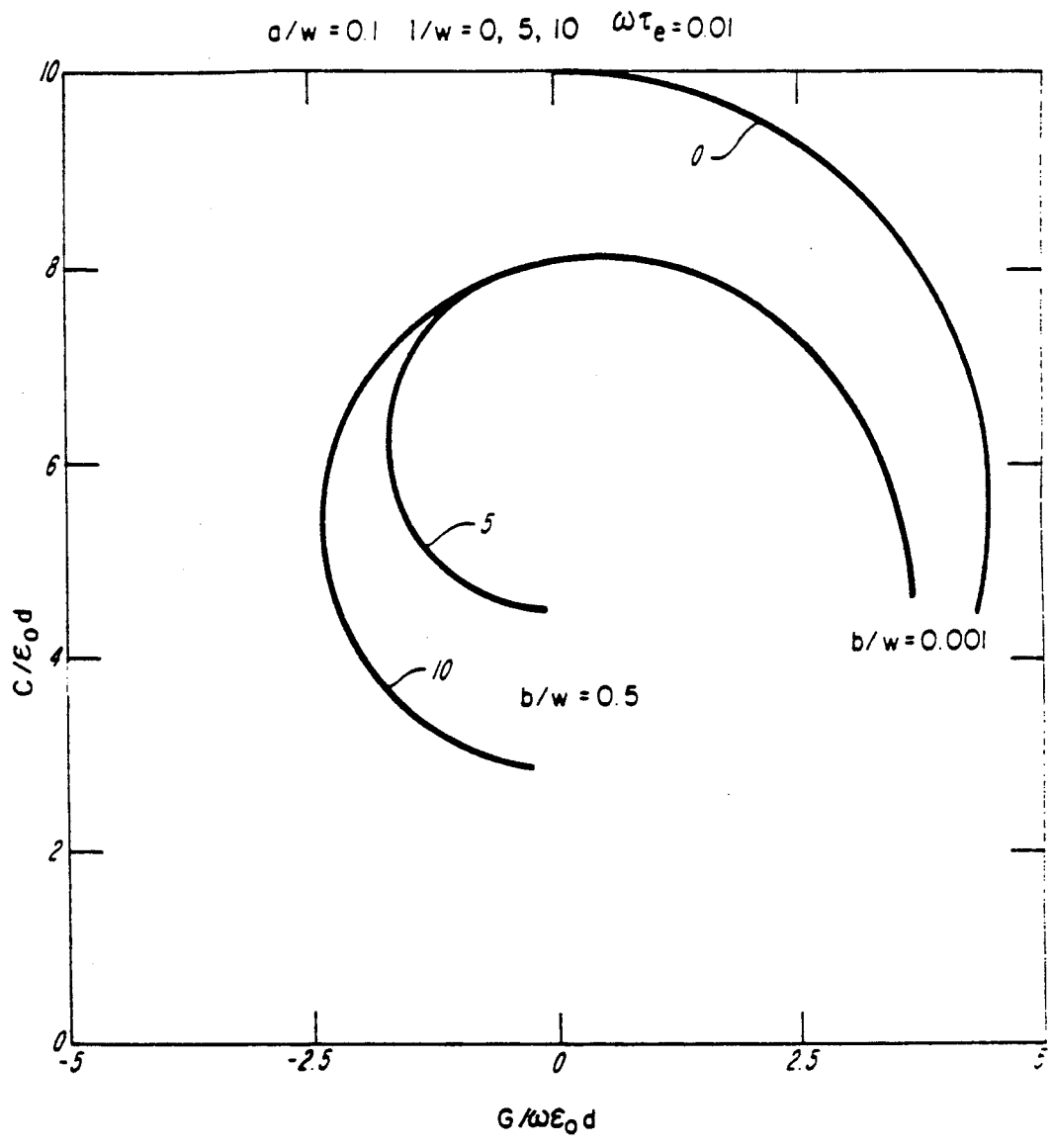
FIG. 24 is a polar plot illustrating normalized complex transfer admittance as a function of $b/w$ and $l/w$ as predicted by the continuum model.

Polar plots of the response of the sensor to changes in the relaxation time and the thickness of the MUT are shown in FIGS. 23 and 24. Because the curves do not close on themselves, each set of measurements provides a unique estimate of the parameter of interest. In addition, the presence of a shunting electrode increases the dynamic range of the normalized capacitance and loss, therefore providing greater resolution in the parameter estimation process. Note that for large values of the normalized relaxation time or thickness of the MUT the sensitivity of the sensor is not affected by increasing of the width of the shunting electrode.

From these plots, regions in the parameter space can be identified in which only the capacitance or the loss need to be measured to infer the property of interest. For example, regions exist in which the capacitance remains essentially constant while the loss changes with the parameter. Similarly, regions exist in which the loss remains constant while the capacitance changes. These regimes may provide means to reduce the cost of the measuring equipment by allowing only one part of the complex transfer admittance to be measured.

Figure 25A:
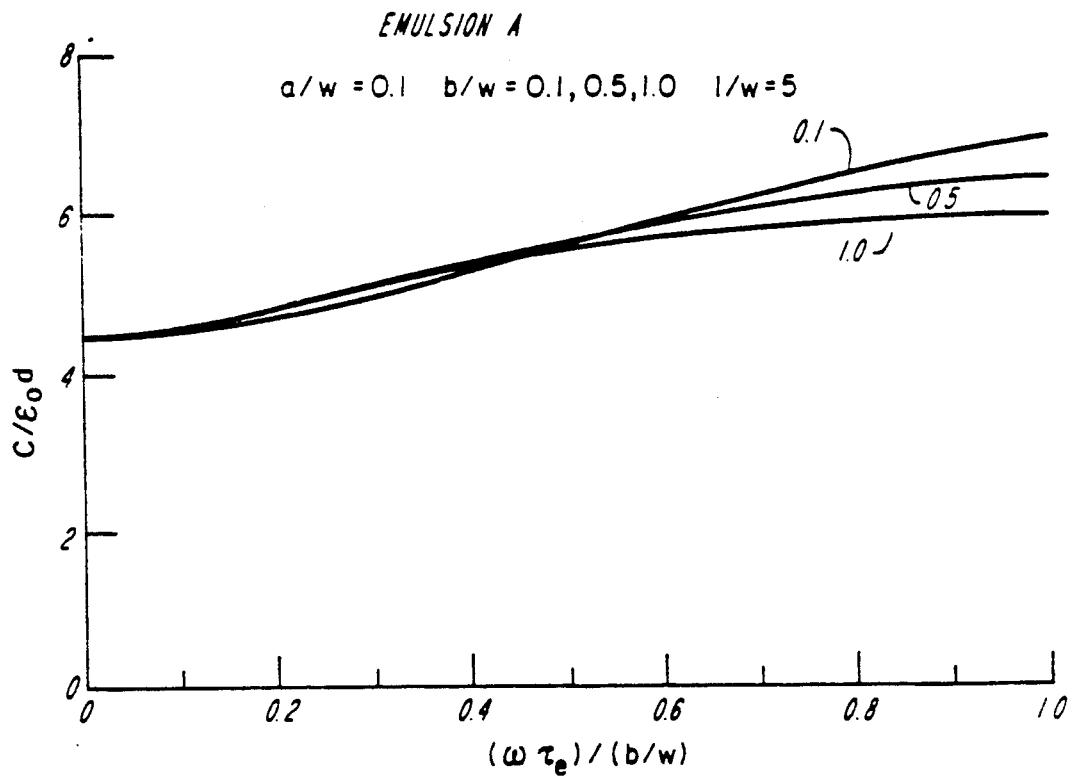
FIGS. 25a and 25b are plots illustrating normalized complex transfer admittance as a function of $(\omega\tau_e)/(b/w)$ and $b/w$ as predicted by the continuum model.
Figure 25B:
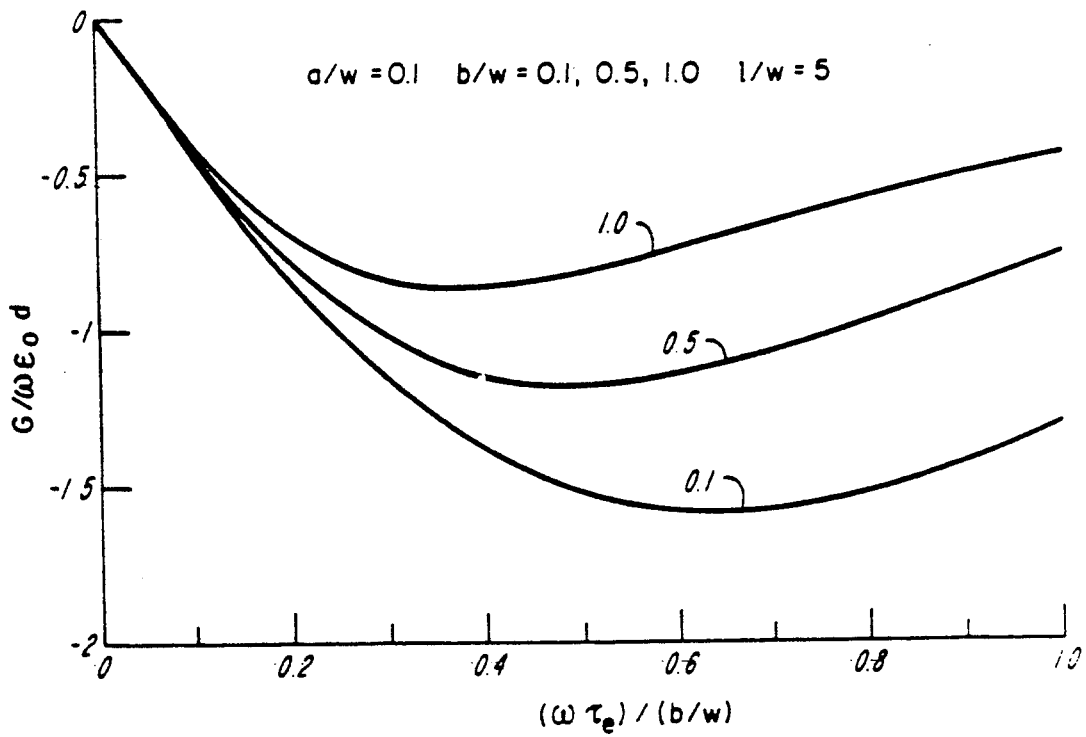

The lumped-parameter model indicated that over the range of parameters allowed, it was not possible to parameter estimate the conductivity and the thickness of the MUT at the same time. The continuum model allows this parameter range to be extended and thus to investigate the possibility of a two-parameter estimation regime. A plot of the normalized capacitance and loss as a function of the ratio of the normalized relaxation time to the normalized MUT thickness is shown in FIG. 25. In the figure three curves are plotted for different values of the normalized MUT thickness. Two regimes can be identified in this plot. For low values of the ratio, the three curves converge into one. This is the same regime identified by the lumped-parameter model in which the two properties cannot be estimated independently. As the ratio increases, the curves diverge indicating that the conductivity and thickness of the MUT can be estimated from one set of measurements. In addition, as the thickness of the MUT decreases the range of parameters over which the two properties can be estimated independently decreases. This is consistent with the lumped-parameter model results shown in FIG. 20.

Comparison of the Models

Figure 26A:
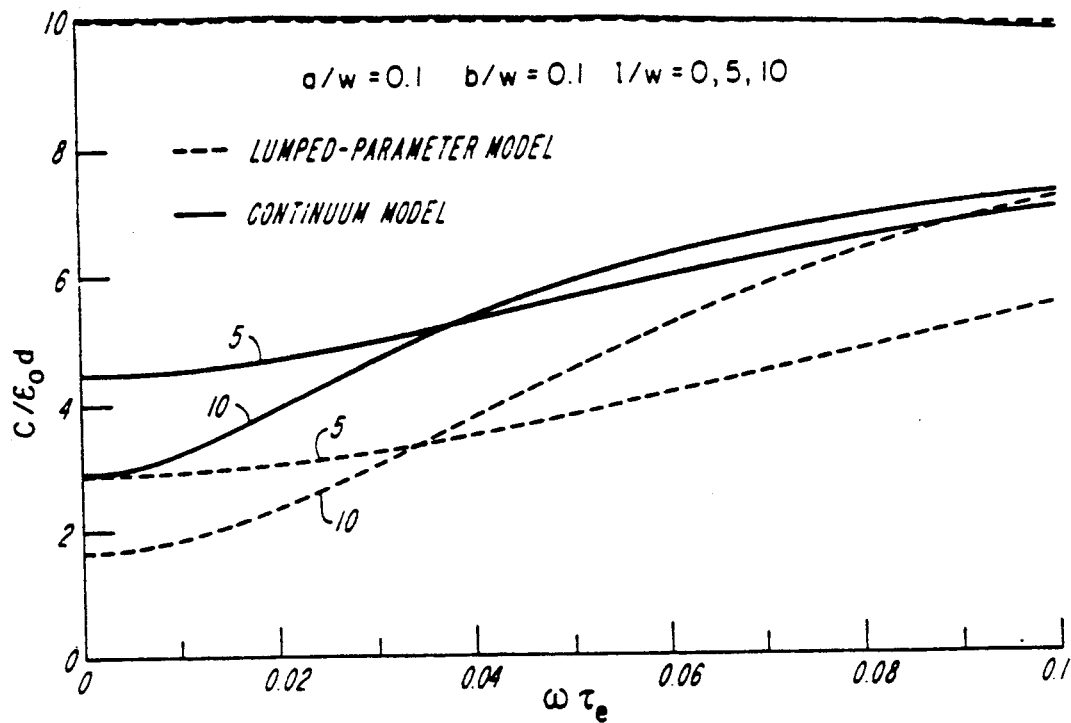
FIGS. 26a and 26b are plots comparing normalized complex transfer admittance as a function of $\omega\tau_e$ and $l/w$ as predicted by the lumped-parameter model and the continuum model.
Figure 26B:
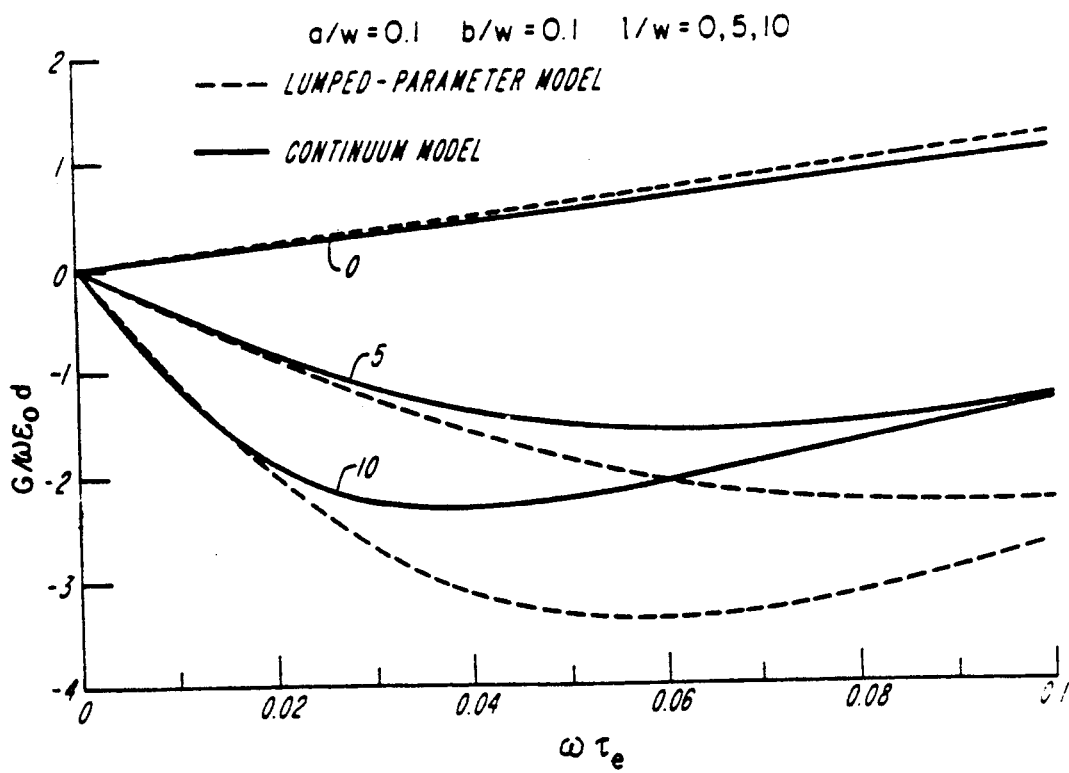

With the goal of comparing the responses predicted by the lumped-parameter and the continuum models, a plot of the normalized capacitance and loss as a function of the normalized relaxation time was generated with the continuum model using the same characteristic length ratios used in the lumped-parameter model response of FIG. 16. The comparison is made in FIG. 26 where the curves drawn with dashed lines represent the responses generated by the lumped-parameter model, and the continuous lines represent the responses generated by the continuum model.

Comparison of the normalized capacitances indicates that in estimating the values of the lumped parameters, the capacitance of the shunting electrode was overestimated. The value of the base capacitance appears to have been estimated correctly since the normalized capacitances agree for the case in which the shunting electrode is absent. The variations in the capacitance with the normalized relaxation time are similar for the two models up to a value of 0.04 for the normalized relaxation time. Beyond this point, the lumped-parameter model deviates from the continuum model because the assumption made in the estimates of the lumped resistances break down.

The normalized losses predicted by the two models appear to be in agreement at low frequencies but begin to deviate from each other as the normalized relaxation time exceeds a value of 0.02. In fact, the frequency at which the peak loss occurs is lower for the continuum model as compared with the lumped-parameter model. This is evidence to the fact that the lumped-parameter model is valid only for frequencies low compared with the reciprocal of the relaxation time ($\omega\tau_e \ll 1$). The loss characteristics in the absence of a shunting electrode show similar trends but are not significantly affected by the breakdown in the assumptions of the lumped-parameter model.

Conclusions

Two models have been presented that describe the effect of a shunting electrode on the measurement of the dielectric and geometric properties of a MUT. The responses demonstrated that the sensitivity of the sensor to changes in the properties of the MUT is greatly enhanced by the presence of a shunting electrode. In addition, as the width of this electrode is increased, the frequency at which the peak response occurs decreases. These features allow the measurement of conduction losses in the MUT to be made at frequencies orders of magnitude below those required in the absence of a shunting electrode.

From the characteristic responses the regime of operation can be selected by varying either the electrode geometry or the frequency of excitation. Once the range of dielectric properties has been identified, the width of the shunting electrode can be optimized to give the desired sensitivity to changes in the properties of the MUT. In addition, because the output signal is sensitive to changes in the relaxation time normalized to the frequency of excitation, the frequency can be selected to enhance this sensitivity.

While the output signal is sensitive to conduction losses in the low-frequency range ($\omega\tau_e \ll 1$), its sensitivity to the dielectric constant of the MUT is significant only at higher frequencies ($\omega\tau_e \sim 1$). This apparatus is thus best suited for the measurement of the conductivity of conducting MUTs. In addition, the output signal is very sensitive to the thickness of the MUT for thicknesses smaller than the width of the electrodes.

Physical phenomena which affect the dielectric and geometric properties of the MUT can be directly inferred from electrical measurements. As it affects the conductivity of a solution, the concentration of a solute in a solvent can be inferred by calibration. In addition, it is possible to measure the concentration of multiple-component mixtures if the mobility of the ions are sufficiently disparate that their effect on the conductivity can be decoupled by varying the frequency of excitation. Note that, unlike the ohmic materials in this model, these MUTs would be described in terms of a frequency-dependent mobility. The swelling resulting from chemical changes in biological tissues and membranes could be monitored as a change in the thickness of the material. Note that calibration is not required if the constitutive laws describing the relationship of these phenomena to the property being measured are known.

Parameter estimation schemes provide means to deconvolve the response in order to obtain a measure of the property of interest. Polar plots of the characteristic responses demonstrated that either the conductivity or the thickness of the MUT could be estimated from one set of measurements. In addition, regions of the parameter space could be identified in which only the measurement of the capacitance or the loss were necessary to infer the property of interest. Further analysis showed that both parameters can be estimated from one set of measurements in a limited parameter range. This range decreases with the thickness of the MUT. Simple numerical techniques (see *Numerical recipes: the Art of Scientific Computing* by W. H. Press et al., Cambridge University Press, Cambridge, 1986, Chapters 9 and 10) involving the minimization of the quadratic error norm (see *System Identification: Theory for the User* by L. Ljung, Prentice-Hall, N.J., 1987, p. 282) can be used to estimate the property of interest from the parameter space.

Experimental Demonstration

To illustrate the increase in sensitivity gained by the use of a shunting electrode, measurements were made using a sensor with and without a shunting electrode. The sensor was implemented in the pipe configuration illustrated in FIG. 11a. For the experiment without a shunting electrode, an insulating pipe was used; for the experiment with a shunting electrode, a metal pipe acted as the shunting electrode. In this implementation the electrode width w was 0.1", the insulating base thickness a was 0.001" and the length d of the electrodes was 1.5". In the case of the metal pipe, the circumferential length not covered by the sensor provided a shunt electrode width l of 1.1". The materials tested were finish emulsions used in industrial polymer processing.

Figure 27A:
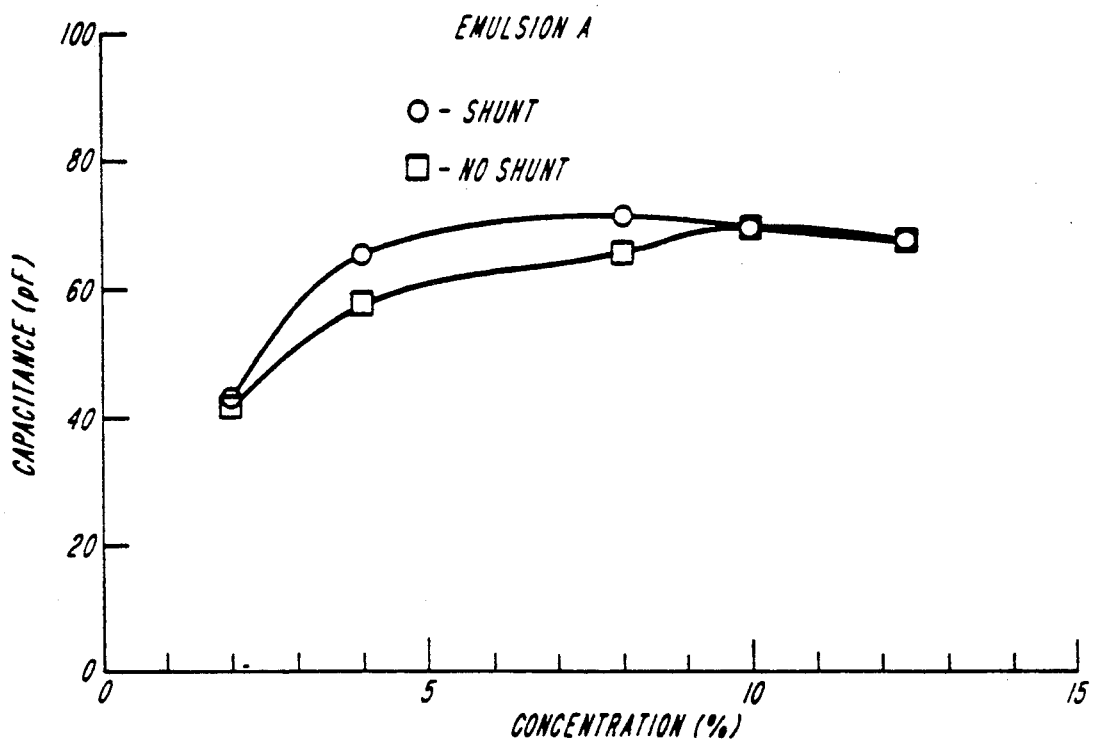
FIGS. 27a and 27b are plots illustrating measured complex transfer admittance as a function of MUT concentration for sensors without and without the shunting electrode of the present invention.
Figure 27B:
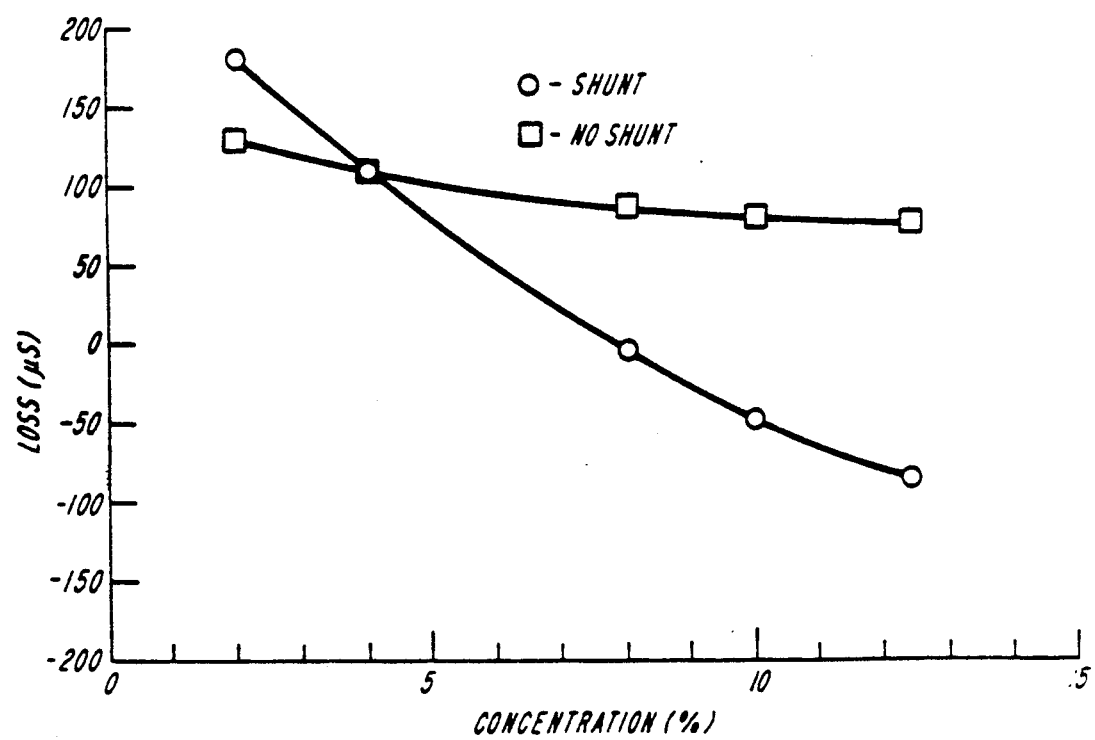
Figure 28A:
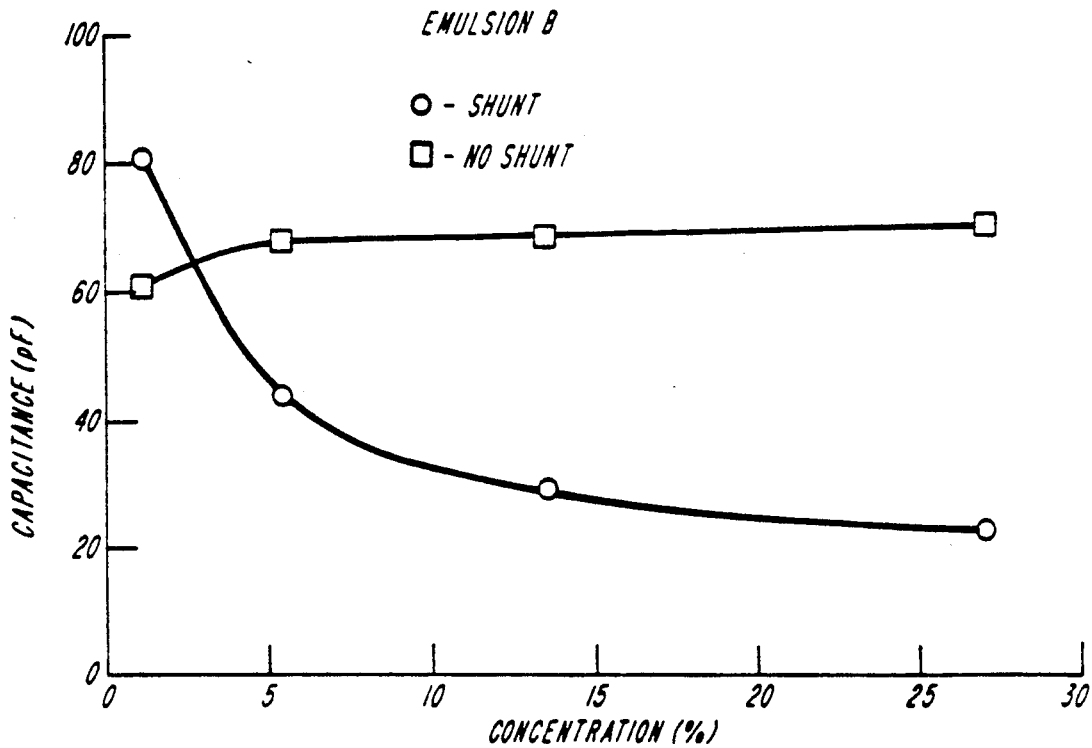
FIGS. 28a and 28b are further plots illustrating measured complex transfer admittance as a function of MUT concentration for sensors without and without the shunting electrode of the present invention.
Figure 28B:
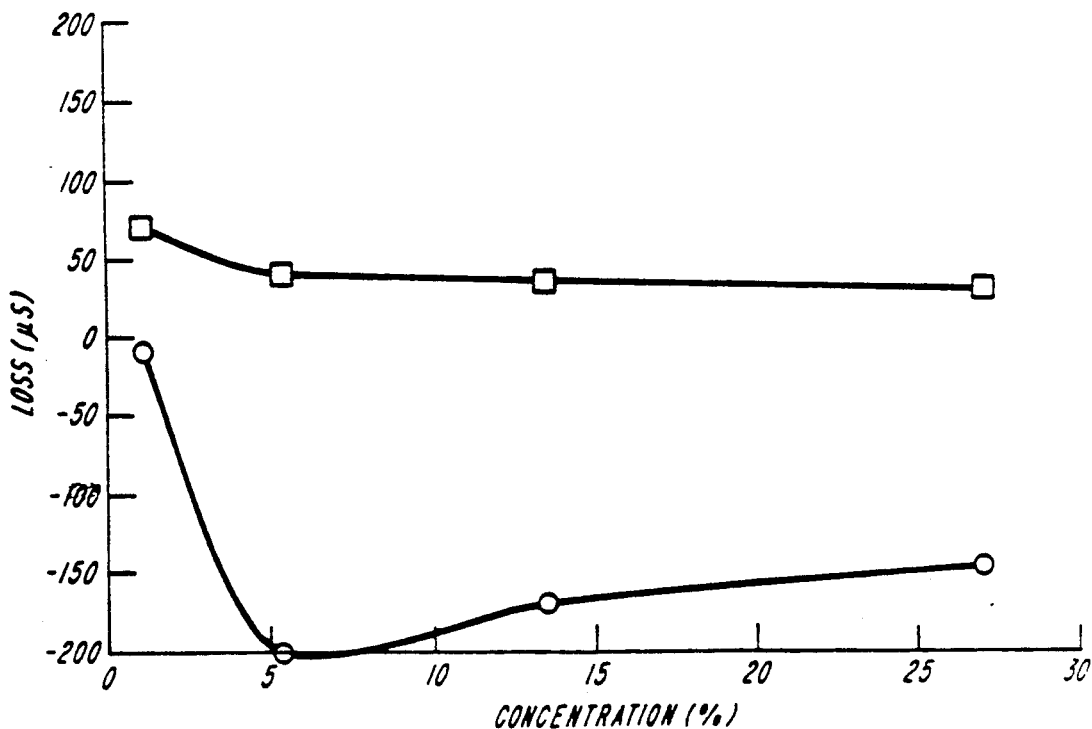

Plots of the capacitance and loss as a function of the concentration of the non-aqueous component are shown in FIGS. 27 and 28 for two emulsions. Emulsion B is known to be more conducting than emulsion A. The conductivity of each emulsion increases with the concentration. The excitation frequency is 1 MHz. Comparison is made in each plot between the sensor with and without the shunting electrode. For the less conducting emulsion A, only the capacitance of the sensor with the shunting electrode is shown. The capacitance of the sensor without the shunting electrode remained constant throughout the range of concentrations measured. The loss of the sensor clearly shows the significant effect of the shunt electrode on the sensitivity of the sensor. The slope of the line increases by a factor of 5 with the presence of the shunting electrode. For the more conducting emulsion B, the same effect can be observed. At low concentrations, the capacitance is 5 times more sensitive and the loss is 8 times more sensitive for the sensor with the shunting electrode. F is still enhanced. The sensitivity increases by a factor of 3 for the capacitance and a factor of 4 for the loss.

These plots also demonstrate regimes in which only one measured parameter is necessary to infer the concentration of the emulsion. For the less conducting emulsion A, the loss provides sufficient information to deduce the concentration. For the more conducting emulsion B, the measured capacitance is sufficient to infer the concentration of the emulsion. Note that in this latter case, the loss is double-valued and therefore cannot be used alone to deduce the concentration of the emulsion over the entire range.

What is claimed is:

1. A sensor for measuring properties of a material under test, the sensor comprising:
    an electrode pair comprising a driven electrode and a sensing electrode disposed in proximity to a material under test;
    terminal means for connecting said driven electrode to electrical signal generating means for providing an electrical signal to said driven electrode to generate an electric field which couples to said sensing electrode thereby generating an electrical signal at said sensing electrode;
    terminal means for connecting said sensing electrode to electrical signal receiving means for receiving the signal at said sensing electrode; and
    a shunting electrode to shunt a portion of said electric field away from said sensing electrode, the shunting electrode having a width greater than that of the driven electrode and of the sensing electrode, disposed at a position in external proximity to said electrode pair and in proximity to the material under test, and held at an electrical potential, the position, width, and electrical potential of said shunting electrode selected to vary the coupling of the electric field to the sensing electrode as a function of the properties of the material under test and to permit measurement of properties of the material under test from the signal at the sensing electrode with a sensitivity significantly greater than that possible in the absence of said shunting electrode.

2. The sensor of claim 1 wherein the electrical signal provided to the driven electrode is an AC signal.

3. The sensor of claim 1 wherein the shunting electrode is maintained at a fixed potential.

4. The sensor of claim 1 wherein the shunting electrode is maintained at ground potential.

5. The sensor of claim 1 wherein the electrodes are substantially flat and the shunting electrode has a substantially greater surface area than the sensing electrode.

6. The sensor of claim 1 wherein the electrodes are formed as parallel strips of a conducting material.

7. The sensor of claim 1 wherein the electrodes are formed as concentric rings of a conducting material.

8. The sensor of claim 6 or 7 wherein the shunting electrode is wider than the sensing electrode and the driven electrode.

9. The sensor of claim 1 wherein one of the electrodes of said electrode pair is formed of two distinct but electrically connected conducting structures disposed on either side of the other electrode of the electrode pair, and wherein said shunting electrode is formed of two distinct but electrically connected conducting structures disposed on either side of the electrode pair.

10. The sensor of claim 1 wherein one of the electrodes of said electrode pair is formed as a first strip of a conducting material and the other electrode of said electrode pair is formed as electrically-connected second and third strips of a conducting material, the second and third strips disposed parallel to said first strip, one on each side of said first strip, and wherein said shunting electrode is formed as electrically-connected fourth and fifth strips of a conducting material, the fourth and fifth strips disposed parallel to the first, second, and third strips, the fourth strip adjacent to the second strip, and the fifth strip adjacent to the third strip.

11. The sensor of claim 10 wherein the first, second, and third strips are approximately the same length, wherein the width of the first strip is approximately twice the widths of the second and third strips, and wherein the distances between the first and the second strips and between the first and the third strips are approximately equal to the width of the second and third strips.

12. The sensor of claim 11 wherein the fourth and fifth strips have approximately the same length as the first, second, and third strips, wherein the fourth and fifth strips are wider than the first, second, and third strips, and wherein the distances between the second and fourth strips and between the third and fifth strips are approximately equal to the width of the second and third strips.

13. The sensor of claim 1 further comprising a ground electrode disposed in proximity to the driven, sensing, and shunting electrodes.

14. The sensor of claim 1 wherein the electrodes are formed on an insulating substrate having a grounded back plane.

15. The sensor of claim 14 wherein said grounded back plane and said shunting electrode are electrically connected.

16. The sensor of claim 14 wherein said grounded back plane and said shunting electrode are formed of a continuous strip of a conducting material.

17. The sensor of claim 1 wherein the driven, sensing, and shunting electrodes are separated from the material under test by an insulating layer.

18. The sensor of claim 1 wherein the shunting electrode is exposed to the material under test.

19. The sensor of claim 1 wherein the shunting electrode is porous and exposed to the material under test, whereby the material under test flows through the shunting electrode.

20. The sensor of claim 1 wherein the driven, sensing, and shunting electrodes are substantially flat and coplanar.

21. The sensor of claim 1 wherein the sensor is flexible.

22. The sensor of claim 1 wherein the driven, sensing, and shunting electrodes are disposed on a wall of a pipe through which the material under test flows.

23. The sensor of claim 1 wherein the driven and sensing electrodes are disposed on and insulated from an inner wall of a conducting pipe through which the material under test flows, whereby the conducting pipe itself functions as the shunting electrode and as a ground plane.

24. The sensor of claim 1 wherein the driven, sensing, and shunting electrodes are disposed on an outer wall of an insulating structure containing the material under test.

25. The sensor of claim 1 wherein said driven and sensing electrodes are disposed in a first plane and said shunting electrode is disposed in a second plane parallel to said first plane.

26. The sensor of claim 1 wherein said driven and sensing electrodes are disposed along a first cylinder and said shunting electrode is disposed along a second cylinder concentric with said first cylinder.

27. The sensor of claim 1 further comprising temperature sensing means for measuring the temperature of the material under test.

28. Apparatus for measuring properties of a material under test, the apparatus comprising:

an electrode pair comprising a driven electrode and a sensing electrode disposed in proximity to a material under test;

electrical signal generating means connected to said driven electrode for providing an electrical signal to said driven electrode to generate an electric field which couples to said sensing electrode thereby generating an electrical signal at said sensing electrode;

electrical signal receiving means connected to said sensing electrode for receiving the signal at said sensing electrode;

a shunting electrode to shunt a portion of said electric field away from said sensing electrode, the shunting electrode having a width greater than that of the driven electrode and of the sensing electrode, disposed at a position in proximity to said electrode pair and in proximity to the material under test, and held at an electrical potential, the position, width, and electrical potential of said shunting electrode selected to vary the coupling of the electric field to the sensing electrode as a function of the properties of the material under test;

measurement apparatus for measuring an electrical parameter or parameters describing the coupling of the electric field between the driven electrode and the sensing electrode, the measurement made in response to the electrical signals at the driven and sensing electrodes; and computing apparatus for estimating one or more quantities relating to the properties of the material under test from the measured parameters with a sensitivity significantly greater than that possible in the absence of said shunting electrode.

29. The apparatus of claim 28 wherein the shunting electrode is disposed externally to the driven and sensing electrodes of said electrode pair.

30. The apparatus of claim 28 wherein the electrical signal provided to the driven electrode is an AC signal.

31. The apparatus of claim 28 wherein the shunting electrode is maintained at a fixed potential.

32. The apparatus of claim 28 wherein the shunting electrode is maintained at ground potential.

33. The apparatus of claim 28 wherein the electrodes are substantially flat and the shunting electrode has a substantially greater surface area than the sensing electrode.

34. The apparatus of claim 28 wherein the electrodes are formed as parallel strips of a conducting material.

35. The apparatus of claim 28 wherein the electrodes are formed as concentric rings of a conducting material.

36. The apparatus of claim 34 or 35 wherein the shunting electrode is wider than the sensing electrode and the driven electrode.

37. The apparatus of claim 28 wherein one of the electrodes of said electrode pair is formed of two distinct but electrically connected conducting structures disposed on either side of the other electrode of the electrode pair, and wherein said shunting electrode is formed of two distinct but electrically connected conducting structures disposed on either side of the electrode pair.

38. The apparatus of claim 28 wherein one of the electrodes of said electrode pair is formed as a first strip of a conducting material and the other electrode of said electrode pair is formed as electrically-connected second and third strips of a conducting material, the second and third strips disposed parallel to said first strip, one on each side of said first strip, and wherein said shunting electrode is formed as electrically-connected fourth and fifth strips of a conducting material, the fourth and fifth strips disposed parallel to the first, second, and third strips, the fourth strip adjacent to the second strip, and the fifth strip adjacent to the third strip.

39. The apparatus of claim 38 wherein the first, second, and third strips are approximately the same length, wherein the width of the first strip is approximately twice the widths of the second and third strips, and wherein the distances between the first and the second strips and between the first and the third strips are approximately equal to the width of the second and third strips.

40. The apparatus of claim 39 wherein the fourth and fifth strips have approximately the same length as the first, second, and third strips, wherein the fourth and fifth strips are wider than the first, second, and third strips, and wherein the distances between the second and fourth strips and between the third and fifth strips are approximately equal to the width of the second and third strips.

41. The apparatus of claim 28 further comprising a ground electrode disposed in proximity to the driven, sensing, and shunting electrodes.

42. The apparatus of claim 28 wherein the electrodes are formed on an insulating substrate having a grounded back plane.

43. The apparatus of claim 42 wherein said grounded back plane and said shunting electrode are electrically connected.

44. The apparatus of claim 42 wherein said grounded back plane and said shunting electrode are formed of a continuous strip of a conducting material.

45. The apparatus of claim 28 wherein the driven, sensing, and shunting electrodes are separated from the material under test by an insulating layer.

46. The apparatus of claim 28 wherein the shunting electrode is exposed to the material under test.

47. The apparatus of claim 28 wherein the shunting electrode is porous and exposed to the material under test, whereby the material under test flows through the shunting electrode.

48. The apparatus of claim 28 wherein the driven, sensing, and shunting electrodes are substantially flat and coplanar.

49. The apparatus of claim 28 wherein the driven, sensing, and shunting electrodes are flexible.

50. The apparatus of claim 28 wherein the driven, sensing, and shunting electrodes are disposed on a wall of a pipe through which the material under test flows.

51. The apparatus of claim 28 wherein the driven and sensing electrodes are disposed on and insulated from an inner wall of a conducting pipe through which the material under test flows, whereby the conducting pipe itself functions as the shunting electrodes and as a ground plane.

52. The apparatus of claim 28 wherein the driven, sensing, and shunting electrodes are disposed on an outer wall of an insulating structure containing the material under test.

53. The apparatus of claim 28 wherein said driven and sensing electrodes are disposed in a first plane and said shunting electrode is disposed in a second plane parallel to said first plane.

54. The sensor of claim 28 wherein said driven and sensing electrodes are disposed along a first cylinder and said shunting electrode is disposed along a second cylinder concentric with said first cylinder.

55. The apparatus of claim 28 further comprising temperature sensing means for measuring the temperature of the material under test.

56. A method for measuring the properties of a material under test comprising:
 disposing an electrode pair in proximity to a material under test, said electrode pair comprising a driven electrode and a sensing electrode;
 providing an electrical signal to said driven electrode to generate an electric field which couples to said sensing electrode thereby generating an electrical signal at said sensing electrode;
 disposing a shunting electrode having a width greater than that of the driven electrode and of the sensing electrode at a position in proximity to said electrode pair and said material under test, and holding said shunting electrode at an electrical potential to shunt a portion of said electric field away from said sensing electrode, the position, width, and electrical potential of said shunting electrode selected to vary the coupling of the electric field to the sensing electrode as a function of the properties of the material under test;
 measuring an electrical parameter or parameters describing the coupling of the electric field between the driven electrode and the sensing electrode, the measurement made in response to the electrical signals at the driven and sensing electrodes; and
 estimating one or more quantities relating to the properties of the material under test from the measured parameters with a sensitivity significantly greater than that possible in the absence of said shunting electrode.

57. The method of claim 56 wherein the electrical parameter is a complex transfer admittance measured between the driven electrode and the sensing electrode.

58. The method of claim 56 wherein the electrical parameter is a complex gain measured between the driven electrode and the sensing electrode.

59. The method of claim 56 wherein the electrodes are incorporated in an RLC circuit and wherein the electrical parameters are resonant frequency and Q factor.

60. The method of claim 56 wherein said at least one quantity includes the permittivity of the material under test.

61. The method of claim 56 wherein said at least one quantity includes the conduction and/or dielectric losses of the material under test.

62. The method of claim 56 wherein said at least one quantity includes the thickness of the material under test.

63. The method of claim 56 wherein said at least one quantity includes the spatial relationship of the electrodes relative to the material under test.

64. The method of claim 56 wherein said at least one quantity includes a quantity representative of a property of the material under test that affects the permittivity and/or the conduction and/or dielectric losses of the material under test.

65. The method of claim 64 wherein said quantity is a concentration of a solute in a solvent.

66. The method of claim 64 wherein said quantity is a degree of emulsification.

67. The method of claim 56 further comprising selecting the size of the shunting electrode to provide optimum sensitivity for a measurement of interest.

68. The method of claim 56 further comprising selecting the frequency of the driving electrical signal to provide optimum sensitivity for a measurement of interest.

69. The method of claim 56 wherein the electrical parameter or parameters are measured at a plurality of frequencies to quantify properties of multi-component materials under test.

70. The method of claim 56 wherein said at least one quantity is estimated using parameter estimation techniques.

* * * * *

UNITED STATES PATENT AND TRADEMARK OFFICE
CERTIFICATE OF CORRECTION

PATENT NO. : 5,223,796
DATED : June 29, 1993
INVENTOR(S) : Francis A. Waldman, et. al.

It is certified that error appears in the above-indentified patent and that said Letters Patent is hereby corrected as shown below:

Column 1, line 6: delete "maee" and insert therefor -- made --;

Column 9, line 64: delete "be";

Column 14, line 23: delete "C=Tm" and insert therefor -- C=Sm --;

Column 15, line 25: delete "1 = 0" and insert therefor -- $\ell = 0$ --;

Column 21, line 58: delete "F is still enhanced." and insert therefor -- For concentrations above 5%, the slopes decrease but the sensitivity is still enchanced. --; and Column 25, line 67: delete "sensor" and insert therefor -- apparatus --.

Signed and Sealed this

Nineteenth Day of July, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

| | |
|---|---|
| PATENT NO. | : 5,223,796 |
| APPLICATION NO. | : 07/706406 |
| DATED | : June 29, 1993 |
| INVENTOR(S) | : Francis A. Waldman and Philip A. von Guggenberg |

It is certified that error appears in the above-identified patent and that said Letters Patent is hereby corrected as shown below:

On the title page item (75), Inventors: delete "Philip A. von Guttenberg" and insert therefor -- Philip A. von Guggenberg --.

Signed and Sealed this

Twenty-seventh Day of April, 2010

David J. Kappos
*Director of the United States Patent and Trademark Office*